United States Patent
Okumura et al.

(10) Patent No.: US 9,583,731 B2
(45) Date of Patent: Feb. 28, 2017

(54) ORGANIC ELECTROLUMINESCENCE ELEMENT

(71) Applicant: PANASONIC INTELLECTUAL PROPERTY MANAGEMENT CO., LTD., Osaka (JP)

(72) Inventors: Shin Okumura, Osaka (JP); Hitomichi Takano, Osaka (JP); Hirofumi Kubota, Osaka (JP); Kazuyuki Yamae, Nara (JP); Masao Kirihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/418,560

(22) PCT Filed: Sep. 4, 2013

(86) PCT No.: PCT/JP2013/005240
§ 371 (c)(1),
(2) Date: Jan. 30, 2015

(87) PCT Pub. No.: WO2014/041764
PCT Pub. Date: Mar. 20, 2014

(65) Prior Publication Data
US 2015/0303405 A1    Oct. 22, 2015

(30) Foreign Application Priority Data
Sep. 13, 2012    (JP) .................................. 2012-201192

(51) Int. Cl.
*H01L 29/08*    (2006.01)
*H01L 35/24*    (2006.01)
(Continued)

(52) U.S. Cl.
CPC ...... *H01L 51/5253* (2013.01); *H01L 51/5203* (2013.01); *H01L 51/5268* (2013.01);
(Continued)

(58) Field of Classification Search
CPC ............. H01L 2924/0002; H01L 51/56; H01L 51/5212; H01L 51/5228; H01L 51/5237;
(Continued)

(56) References Cited

U.S. PATENT DOCUMENTS

2002/0110940 A1    8/2002    Yamagata et al.
2004/0265518 A1    12/2004    Yoshizawa
(Continued)

FOREIGN PATENT DOCUMENTS

JP    07-249727    9/1995
JP    2003-192400    7/2003
(Continued)

OTHER PUBLICATIONS

R.Morrell, Thermal Expansion, Dec. 2, 2015, National Physics Laboratory, Kaye & Laby Table of Physical & Chemical Constants, Chapter 2, Section 2.3, Subsection 2.3.5.*
(Continued)

*Primary Examiner* — Robert Huber
*Assistant Examiner* — Nduka Ojeh
(74) *Attorney, Agent, or Firm* — Greenblum & Bernstein, P.L.C.

(57) ABSTRACT

The present invention relates to an organic electroluminescence element in which a transparent first electrode, an organic light emitting layer, a second electrode are stacked on a translucent substrate in this order. The translucent substrate includes a moisture-proof layer facing the first electrode. An LR layer and an HR layer having a refractive index higher than a refractive index of the LR layer are situated between the moisture-proof layer and the first
(Continued)

electrode in this order from the moisture-proof layer. An uneven structure is provided at an interface between the LR layer and the HR layer. A linear expansivity $\alpha$ of the moisture-proof layer, and a linear expansivity $\beta$ of the LR layer, and a linear expansivity $\gamma$ of the HR layer satisfy a relation of $\alpha \leq \beta \leq \gamma$.

10 Claims, 4 Drawing Sheets

(51) Int. Cl.
*H01L 51/00* (2006.01)
*H01L 51/52* (2006.01)

(52) U.S. Cl.
CPC ...... *H01L 51/5275* (2013.01); *H01L 51/5212* (2013.01); *H01L 2251/5361* (2013.01)

(58) Field of Classification Search
CPC ......... H01L 2251/5315; H01L 27/3244; H01L 27/3246; H01L 51/5268; H01L 51/5271; H01L 27/1218; H01L 27/3288; H01L 27/3295
USPC ............... 257/40, E51.018, 98, E51.026, 88, 257/E33.073; 438/29, 46, 99, 34
See application file for complete search history.

(56) References Cited

U.S. PATENT DOCUMENTS

| | | | |
|---|---|---|---|
| 2005/0263775 A1 | 12/2005 | Ikeda et al. | |
| 2006/0033429 A1* | 2/2006 | Fujimura et al. | 313/509 |
| 2006/0049745 A1 | 3/2006 | Handa et al. | |
| 2006/0108919 A1* | 5/2006 | Kobayashi | 313/506 |
| 2006/0214925 A1* | 9/2006 | Taninaka | G06F 3/0412 345/173 |
| 2007/0181912 A1 | 8/2007 | Ikeda et al. | |
| 2009/0066219 A1 | 3/2009 | Handa et al. | |
| 2009/0066220 A1* | 3/2009 | Handa | H01L 51/5268 313/503 |
| 2010/0026178 A1* | 2/2010 | Hwang et al. | 313/506 |
| 2010/0148204 A1 | 6/2010 | Ikeda et al. | |
| 2010/0182222 A1 | 7/2010 | Ichihashi et al. | |
| 2011/0180836 A1* | 7/2011 | Son | H01L 27/3283 257/98 |
| 2012/0099331 A1 | 4/2012 | Yamazaki et al. | |
| 2012/0292652 A1 | 11/2012 | Yamae et al. | |
| 2012/0299035 A1 | 11/2012 | Ikeda et al. | |
| 2013/0020564 A1 | 1/2013 | Kobayashi et al. | |
| 2013/0221341 A1 | 8/2013 | Iwabuchi et al. | |
| 2013/0234127 A1* | 9/2013 | Sakaguchi | H01L 51/5212 257/40 |
| 2013/0240856 A1 | 9/2013 | Ikeda et al. | |
| 2014/0183509 A1 | 7/2014 | Ikeda et al. | |
| 2014/0209890 A1 | 7/2014 | Sato et al. | |
| 2014/0225099 A1 | 8/2014 | Yamae et al. | |
| 2015/0014672 A1 | 1/2015 | Yamae et al. | |
| 2015/0115242 A1* | 4/2015 | Sakaguchi | H01L 51/52 257/40 |

FOREIGN PATENT DOCUMENTS

| | | | |
|---|---|---|---|
| JP | 2004-296438 | | 10/2004 |
| JP | 2005-322490 | | 11/2005 |
| JP | 2007-041203 | | 2/2007 |
| JP | 2011071024 A | * | 4/2011 |
| JP | 2011-216317 | | 10/2011 |
| JP | 2011-228262 | | 11/2011 |
| JP | 2012-015241 | | 1/2012 |
| JP | 2012-033510 | | 2/2012 |
| JP | 2012-079419 | | 4/2012 |
| JP | 2012-094348 | | 5/2012 |
| JP | 2012-109225 | | 6/2012 |
| JP | 2013-109923 | | 6/2013 |

OTHER PUBLICATIONS

Christian Hollauer, Modeling of Thermal Oxidation and stress Effects, Sep. 3, 2007, The Material Silcon Dioxide, Section 2.1, Table 2.1.*
http://www.kayelaby.npl.co.uk/general_physics/2_3/2_3_5.html.*
U.S. Appl. No. 14/418,141 to Hirofumi Kubota et al., filed Jan. 29, 2015.
Search report from E.P.O. for European Patent Application No. 13837697.5., mail date is Jul. 7, 2015.
U.S. Appl. No. 14/381,633 to Shintaro Hayashi et al., filed Aug. 28, 2014.
U.S. Appl. No. 14/375,458 to Nobuhiro Ide et al., filed Jul. 30, 2014.
U.S. Appl. No. 14/376,694 to Hirofumi Kubota, filed Aug. 5, 2014.
U.S. Application No. to Hirofumi Kubota et al., which was filed on.
Search report from PCT/JP2013/005240, mail date is Oct. 8, 2013.

* cited by examiner

ORGANIC ELECTROLUMINESCENCE ELEMENT

TECHNICAL FIELD

The present invention relates to organic electroluminescence elements.

BACKGROUND ART

In a known general structure of an organic electroluminescence element (hereinafter referred to as "organic EL element"), a transparent electrode used as an anode, a hole transport layer, a light emitting layer, an electron injection layer, and a cathode are stacked on a surface of a transparent substrate in this order. It is known that such an organic EL element is used to produce a planar light emitting device (lighting panel). In this organic EL element, light is produced in an organic light emitting layer in response to application of voltage between the anode and the cathode, and the produced light is emitted outside through the transparent electrode and the transparent substrate and goes outside.

The organic EL element gives a self-emission light in various wavelengths, with a relatively high yield. Such organic EL elements are expected to be applied for production of displaying apparatuses (e.g., light emitters used for such as flat panel displays), and light sources (e.g., liquid-crystal displaying backlights and illuminating light sources). Some of organic EL elements have already been developed for practical uses. Recently, in consideration of application and development of organic EL elements to such uses, an organic EL element having high efficiency, prolonged lifetime, and high brightness is expected.

It is considered that the efficiency of the organic EL element is mainly dominated by three of electrical-optical conversion efficiency, driving voltage, and light-outcoupling efficiency. With regard to the electrical-optical conversion efficiency, it was reported that the organic EL element with the light emitting layer made of phosphorescent light emitting material can have external quantum efficiency greater than 20%. The external quantum efficiency of 20% is considered to be corresponding to internal quantum efficiency of about 100%. It is considered that the organic EL element having the electrical-optical conversion efficiency reaching a limiting value has been developed. In view of the driving voltage, an organic EL element which shows relatively high brightness in receipt of voltage higher by 10 to 20% than voltage corresponding to an energy gap of the light emitting layer has been developed. Consequently, it is expected that improvement of these two factors (electrical-optical conversion) is not so effective for an increase in the efficiency of the organic EL element.

Generally, the organic EL element has the light-outcoupling efficiency in the range of about 20 to 30% (this value slightly changes depending on lighting patterns, and/or a layer structure between the anode and the cathode). This light-outcoupling efficiency is not high. This low light-outcoupling efficiency may be explained by the following consideration: materials used for light emitting portion and a vicinity thereof have characteristics such as a high refractive index and light absorption properties, and therefore the total reflection at the interfaces between materials with different refractive indices and absorption of light by materials may occur and this causes inhibition of effective propagation of light to the outside. Such low light-outcoupling efficiency means 70 to 80% of the total amount of emitted light does not effectively contribute to light emission. Consequently, it is considered that improvement of the light-outcoupling efficiency causes a great increase in the efficiency of the organic EL element.

In consideration of the above background, there is studied and developed actively to improve the light-outcoupling efficiency. Especially, there have been many efforts to increase the amount of light which is emitted from the organic layer and reaches the substrate layer. For example, the organic layer has the refractive index of about 1.7, and a glass layer generally serving as the substrate has the refractive index of about 1.5, and ITO generally used for the transparent electrode has the refractive index in a range of about 1.8 to 2.0. In this case, a loss caused by total reflection at the interface between the transparent electrode and the glass layer probably reaches about 50% of totally reflected light. The value of about 50% is-calculated by use of point source approximation in consideration that the emitted light is expressed as an integration of three dimensional radiation of light from organic molecules. Unfortunately, the total reflection at the interface between the organic layer and the substrate tends to cause a great loss. In view of this, it is possible to greatly improve the light-outcoupling efficiency of the organic EL element by decreasing the loss caused by the total reflection between the organic layer and the substrate.

CITATION LIST

Patent Literature

Patent Literature 1: JP 2005-322490 A

SUMMARY OF INVENTION

Technical Problem

As a method for reducing total reflection loss between the organic layer and the substrate, to provide a layer with a light-outcoupling structure between the substrate and the transparent electrode is known. Such light-outcoupling structures are formed by dispersing fine particles in resin to cause scattering of light or by providing a diffraction structure to a resin layer. When the light-outcoupling structure is present, normally a surface of a layer formed on the light-outcoupling structure is likely to be uneven. In this regard, it is preferable that the transparent electrode and the organic layer be formed on a surface which is not uneven as possible. Hence, generally, the uneven surface of the light-outcoupling structure is covered with a layer with a flat surface. Therefore, the light-outcoupling structure is realized by at least two layers, and is defined as a laminate structure with an uneven interface of these two layers. For example, patent literature 1 discloses a technique of providing a physically uneven region to an interface between two transparent resin layers.

However, in the process of forming the light-outcoupling structure, adjustment of refractive indices may be performed in addition to flattening. Such adjustment of refractive indices may be done by use of particles or the like. In this case, the resin may contain particles and therefore such resin is likely to be brittle. As a result, thermal stresses of two layers may differ, and thus the light-outcoupling structure and stacked layers (e.g., the light emitting layer and the electrode) are likely to be easily cracked. Especially, in the production of the organic EL element, after formation of the light-outcoupling structure, the electrode and the organic layer are formed under a condition where they have a temperature higher than a temperature of resin. In such heating conditions, cracks are likely to easily occur. Therefore, it is impossible to form good stacked layers, and even when the layers are stacked, fine cracks may occur in the layers, and therefore the reliability may become poor. Further, the organic EL layer may generate heat when emitting light, and therefore heat caused by the operation may cause expansion of the layers and this is likely to lead to occurrence of cracks.

In view of the above insufficiency, the present invention has aimed to improve the light-outcoupling efficiency by reducing total reflection loss and suppress occurrence of cracks or the like to propose an organic electroluminescence element with high light emitting performance and high reliability.

Solution to Problem

The organic electroluminescence element in accordance with the present invention includes the following configuration.

The organic electroluminescence element includes: a translucent substrate; a first electrode with light transmissive properties; an organic light emitting layer; and a second electrode. The first electrode, the organic light emitting layer, and the second electrode are stacked on the translucent substrate in this order. The translucent substrate includes a moisture-proof layer facing the first electrode. The organic electroluminescence element includes: an LR layer and an HR layer having a refractive index higher than a refractive index of the LR layer which are situated between the moisture-proof layer and the first electrode in this order from the moisture-proof layer; and an uneven structure provided at an interface between the LR layer and the HR layer. The organic electroluminescence element satisfies a relation of $\alpha \leq \beta \leq \gamma$, wherein $\alpha$ denotes a linear expansivity of the moisture-proof layer, and $\beta$ denotes a linear expansivity of the LR layer, and $\gamma$ denotes a linear expansivity of the HR layer.

In a preferable aspect of the organic electroluminescence element in accordance with the present invention, the organic electroluminescence element further includes an auxiliary electrode which has a mesh-like shape and is provided on a surface of the first electrode. In this case, more preferably, the organic electroluminescence element further includes an insulating film on a side of the auxiliary electrode close to the organic light emitting layer.

In a preferable aspect of the organic electroluminescence element in accordance with the present invention, the organic electroluminescence element further includes a groove region dividing at least the HR layer. In this case, preferably, the groove region divides both the HR layer and the LR layer. Further, more preferably, the groove region becomes smaller in width towards its bottom than at its top. Further, more preferably, the organic electroluminescence element further includes an auxiliary wire provided inside the groove region. Further, more preferably, the auxiliary wire has a thickness equal to or shorter than a depth of the groove region. Further, more preferably, the organic electroluminescence element further includes an insulating part provided inside the groove region so as to be closer to the second electrode than the auxiliary wire is. Further, more preferably, the organic electroluminescence element further includes an insulating layer between the moisture-proof layer and the LR layer. The organic electroluminescence element satisfies a relation of $\alpha \leq \sigma \leq \beta \leq \gamma$, wherein $\sigma$ denotes a linear expansivity of the insulating layer.

Advantageous Effects of Invention

According to the present invention, the light-outcoupling efficiency can be improved by existence of the light-outcoupling structure realized by the LR layer and the HR layer. Further, the linear expansivities of the layers of interest satisfy the aforementioned condition, and therefore it is possible to suppress occurrence of cracks and the like in the layers of interest and other layers formed thereon. As a result, the organic electroluminescence element with high light emitting performance and high reliability can be obtained.

DESCRIPTION OF EMBODIMENTS

Figure 1:
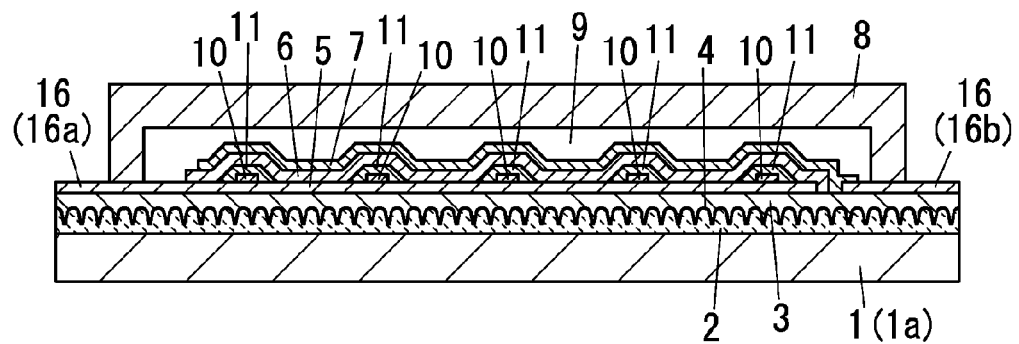
FIG. 1 is a section illustrating an example of an embodiment of an organic electroluminescence element.

FIG. 1 shows an example of an embodiment of the organic electroluminescence element (organic EL element). This organic EL element includes a translucent substrate 1, a first electrode 5 with light transmissive properties, an organic light emitting layer 6, and a second electrode 7. The first electrode 5, the organic light emitting layer 6, and the second electrode 7 are stacked on the translucent substrate 1 in this order. The translucent substrate 1 includes a moisture-proof layer 1a facing the first electrode 5. The organic EL element includes an LR layer 2 and an HR layer 3 having a refractive index higher than a refractive index of the LR layer 2 which are situated between the moisture-proof layer 1a and the first electrode 5 in this order from the moisture-proof layer 1a. The organic EL element includes an uneven structure 4 provided at an interface between the LR layer 2 and the HR layer 3. The organic EL element satisfying a relation of $\alpha \leq \beta \leq \gamma$, wherein $\alpha$ denotes a linear expansivity of the moisture-proof layer 1a, and $\beta$ denotes a linear expansivity of the LR layer 2, and $\gamma$ denotes a linear expansivity of the HR layer 3. As described above, the LR layer 2 which is a layer with a low refractive index is placed adjacent to the translucent substrate 1, and the HR layer 3 which is a layer with a high refractive index is placed adjacent to the first electrode 5, and therefore a difference between refractive indices is reduced and thus total reflection is suppressed, and consequently it is possible to increase an amount of light emerging outside. Further, the uneven structure 4 is provided at the interface between the LR layer 2 and the HR layer 3, and therefore light is scattered by this uneven structure 4, and consequently it is possible to reduce total reflection loss and thus to more improve the light-outcoupling efficiency. Further, the linear expansivities of the LR layer 2 and the HR layer 3 satisfy the aforementioned relation, and therefore it is possible to suppress occurrence of clacks or the like. As a result, it is possible to obtain the organic electroluminescence element which is high in light emitting performance and reliability.

Figure 2:
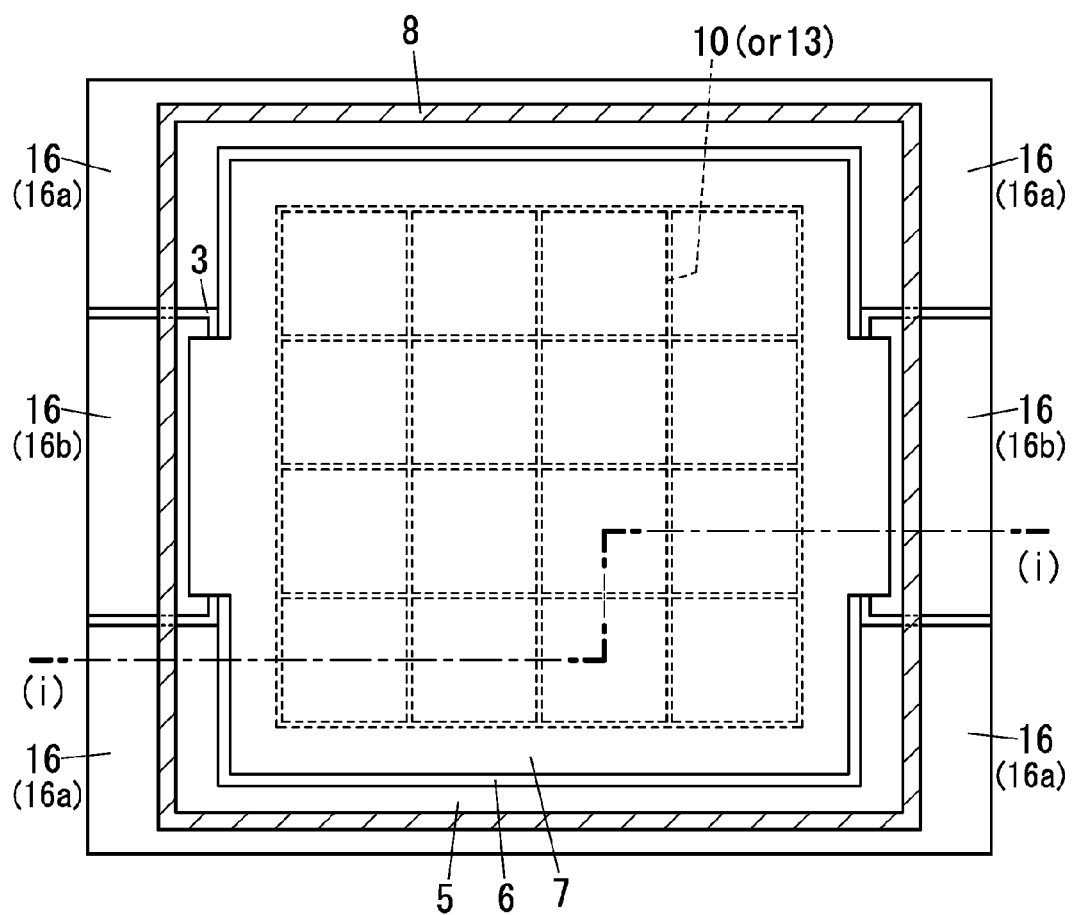
FIG. 2 is a cutaway plan illustrating an example of the embodiment of the organic electroluminescence element.

FIG. 2 shows a plan view of the organic EL element of the implemented embodiment of FIG. 1 (i.e., a representation when viewed in a direction perpendicular to the surface of the translucent substrate 1). In FIG. 2, to clearly illustrate the internal structure of the element, an enclosing member 8 is omitted, and a region to which the enclosing member 8 is to be bonded is illustrated with hatching. Note that, FIG. 1 shows a section along line (i)-(i) in FIG. 2. Further, broken lines represent an auxiliary electrode 10 which is not exposed.

The translucent substrate 1 is a transparent substrate with light transmissive properties. In the present implemented embodiment, the translucent substrate 1 includes the moisture-proof layer 1a with moisture-proof properties. When the translucent substrate 1 includes the moisture-proof layer 1a, it is possible to suppress intrusion of moisture through the translucent substrate 1. It is sufficient that the translucent substrate 1 includes the moisture-proof layer 1a, and therefore the translucent substrate 1 may be constituted by only the moisture-proof layer 1a, or may be constituted by a stack of the moisture-proof layer 1a and a transparent material layer other than the moisture-proof layer 1a. The moisture-proof layer 1a constitutes a part of the translucent substrate 1 facing the first electrode 5. When the translucent substrate 1 is constituted by a single layer which is the moisture-proof layer 1a, the moisture-proof layer 1a serves as a layer of the translucent substrate 1 facing the first electrode 5. When the translucent substrate 1 is constituted by two or more layers, the translucent substrate 1 is constituted by the moisture-proof layer 1a and a transparent material layer provided to the opposite surface of the moisture-proof layer 1a from the first electrode 5. FIG. 1 shows the translucent substrate 1 constituted by a single layer defined by the moisture-proof layer 1a. However, a transparent material layer may be formed on the opposite side of the moisture-proof layer 1a from the first electrode 5. Note that, the term "translucent" means "light transmissive".

The moisture-proof layer 1a may be a glass substrate or the like. When the moisture-proof layer 1a is a glass substrate, glass has low moisture permeability, and therefore it is possible to suppress intrusion of moisture into an inside of an enclosed region. In the organic EL element of the present implemented embodiment, the LR layer 2 and the HR layer 3 are stacked in this order on a surface of the moisture-proof layer 1a of the translucent substrate 1, and a light emitting stack constituted by a stack of the first electrode 5, the organic light emitting layer 6, and the second electrode 7 is provided on a surface of the HR layer 3. In a plan view (when viewed in a direction perpendicular to a surface of a substrate), a region on which the light emitting stack is provided is a central region of the translucent substrate 1. The light emitting stack is enclosed by being covered with the enclosing member 8 which is bonded to the translucent substrate 1 at a position of an outer periphery surrounding the light emitting stack, and thus the light emitting stack is disposed inside the enclosed region.

The first electrode 5 and the second electrode 7 define a pair of electrodes. Normally, the first electrode 5 serves as an anode, and the second electrode 7 serves as a cathode, and however the first electrode 5 may serve as the cathode and the second electrode 7 may serve as the anode. The first electrode 5 has light transmissive properties and may serve as an electrode for allowing light to emerge. Further, the second electrode 7 may have light reflective properties. In this case, light emitted from the light emitting layer towards the second electrode 7 can emerge outside from the translucent substrate 1 by being reflected by the second electrode 7. Alternatively, the second electrode 7 may be an electrode with light transmissive properties. In a case where the second electrode 7 has light transmissive properties, it is possible to obtain a structure which allows light to emerge outside from a surface (rear surface) facing the enclosing member 8. Alternatively, in a case where the second electrode 7 has light transmissive properties, by providing a light reflective layer to a rear surface (an opposite surface from the organic light emitting layer 6) of the second electrode 7, light emitted from the light emitting layer towards the second electrode 7 can emerge outside from the translucent substrate 1 by being reflected. In this regard, the light reflective layer may be diffuse or specular.

The first electrode 5 may be made of transparent electrically conductive material. For example, the transparent electrically conductive material may be preferably electrically conductive metal oxide. The electrically conductive metal oxide may be exemplified by ITO, IZO, AZO, or the like. The second electrode 7 may be made of appropriate electrode material. For example, the second electrode 7 may be made of Al or Ag.

In a case of a structure in which the second electrode 7 is a light transmissive electrode and light is allowed to emerge outside from the enclosing member 8, a light reflective film may be provided to a surface of the translucent substrate 1 (or the moisture-proof layer 1a) facing the outside. When the light reflective film is provided in such a manner, light which is emitted from the organic light emitting layer 6 and passes through the first electrode 5 and travels toward the moisture-proof layer 1a is reflected by the light reflective film, and thereby travels towards the enclosing member 8. Consequently, it is possible to increase an amount of light emerging from the enclosing member 8. The light reflective film may be made of a reflective metal film of Al or Ag.

The organic light emitting layer 6 is a layer with a function of producing light, and is normally constituted by two or more functional layers appropriately selected from hole injection layers, hole transport layers, light emitting layers, electron transport layers, electron injection layers, interlayers, and the like. A thickness of the organic light emitting layer 6 is not limited particularly, and may be in a range of 60 to 300 nm, for example.

In a case where the first electrode 5 is an anode and the second electrode 7 is a cathode, a laminated structure of the organic light emitting layer 6 includes a hole transport layer, a light emitting layer, an electron transport layer, and an electron injection layer which are arranged in this order from the first electrode 5, for example. Note that, the laminated structure is not limited to this example, and for example may be a single structure of a light emitting layer, or a laminated structure of a hole transport layer, a light emitting layer, and an electron transport layer, or a laminated structure of a hole transport layer and a light emitting layer, or a laminated structure of a light emitting layer and an electron transport layer. Further, the light emitting layer may have a single layer structure or a multilayer structure. To obtain a white light emission color, the light emitting layer may be doped with three dopant pigments of red, green, and blue, or a laminated structure of a blue hole transporting light emitting layer, a green electron transporting light emitting layer, and a red electron transporting light emitting layer, or a laminated structure of a blue electron transporting light emitting layer, a green electron transporting light emitting layer, and a red electron transporting light emitting layer. Further, a laminated structure which is interposed between paired electrodes and emits light in response to application of voltage between the paired electrodes may be treated as one light emitting unit. In this case, a multiunit structure may be used. In the multiunit structure, two or more light emitting units are stacked and electrically connected with one or more interlayers in-between. Such interlayers may have light transmissive and electrically conductive properties. The multiunit structure may be a structure in which two or more light emitting units are stacked in a thickness direction between paired electrodes (anode and cathode).

The enclosing member 8 may be made of substrate material with low moisture permeability. Such substrate material may be a glass substrate, for example. In more detail, the substrate material may be soda-lime glass, non-alkali glass, or the like. They are relatively inexpensive glass material and therefore it is possible to reduce production cost of the element. The enclosing member 8 may or may not include a recess for accommodating the light emitting stack. When the enclosing member 8 includes the recess, it is possible to enclose the light emitting stack while covering sides of the light emitting stack. Hence, intrusion of moisture can be suppressed more, and enclosing performance can be improved. The enclosing member 8 including the recess may be a glass cap, for example. When the enclosing member 8 is devoid of the recess, enclosing is made under a condition where a flat surface of the enclosing member 8 faces the translucent substrate 1, and it is possible to use a plate of base material without any modification. However, when the enclosing member 8 is devoid of the recess, it is necessary to form a side wall serving as a space for enclosing the light emitting stack.

The enclosing member 8 is bonded to the translucent substrate 1 with bonding material. The bonding material for bonding the enclosing member 8 is provided to the translucent substrate 1 so as to surround an outer periphery of the light emitting stack. As shown by a hatching region in FIG. 2, in the present implemented embodiment, the bonding material is provided to be in contact with surfaces of separate parts of an electrically conductive layer constituting the first electrode 5 and parts of a surface of the HR layer 3 exposed through gaps between the separate parts of the electrically conductive layer. The enclosing member 8 is bonded to the translucent substrate 1 with the bonding material in this manner, and therefore the light emitting stack is isolated from the outside space and therefore is enclosed.

The bonding material for bonding the enclosing member 8 may be appropriate material functioning as adhesive, and for example resin bonding material. The resin bonding material may preferably have moisture-proof properties. For example, when the resin bonding material contains desiccant, the moisture-proof properties of the resin bonding material can be improved. The resin bonding material may have thermosetting resin, ultraviolet curable resin, or the like as a main component.

A space (an enclosed inner space 9) which is between the translucent substrate 1 and the enclosing member 8 and accommodates the light emitting stack (organic light emitting layer 6) may be filled with filler, or serve as a hollow enclosed space. When the enclosed inner space 9 is used as an enclosed space, enclosing can be easily made by use of the enclosing member 8, and therefore it is possible to facilitate production of the element. Further, when the enclosed inner space 9 is not filled with filler and serves as the enclosed space, it is preferable to provide a desiccant member inside the enclosed space. In this case, even if moisture intrudes into the enclosed space, intruded moisture can be absorbed. For example, to provide the desiccant member inside the enclosed space, the desiccant member may be attached to a surface of the enclosing member 8 facing the light emitting stack.

Further, in a case where the enclosed inner space 9 of the enclosed region between the translucent substrate 1 and the enclosing member 8 is filled with the filler, even when the enclosing member 8 warps inwardly in the process of enclosing with the enclosing member 8, it is possible to prevent contact between the enclosing member 8 and the light emitting stack, for example. Therefore, it is possible to produce the element more safely. The filler may be constituted by a curable resin composition containing desiccant or hygroscopic material. Further, when the resin composition is fluid, it is possible to easily fill the enclosed inner space 9 with the filler. The filler may or may not be curable. Further, when the filler contains desiccant or hygroscopic material, even if moisture intrudes inside, such moisture can be absorbed in the filler, and therefore it is possible to suppress moisture from reaching the organic light emitting layer 6.

In the organic EL element, voltage is applied between the first electrode 5 and the second electrode 7 in order to cause recombination between holes and electrons in the organic light emitting layer 6, thereby light is emitted. Therefore, it is necessary to provide, outside the enclosed region, electrode terminals electrically connected to the first electrode 5 and the second electrode 7. The electrode terminals are terminals for making electrical connection with external electrodes. In the implemented embodiment of FIG. 1, end parts of the electrically conductive layer for forming the first electrode 5 are extended to the peripheral part of the translucent substrate 1 to form extended electrodes 16. These extended electrodes 16 serve as the electrode terminals.

The extended electrodes 16 are positioned on a surface of a peripheral part of the translucent substrate 1. In the implemented embodiment of FIG. 1, the extended electrodes 16 are formed on a surface of the HR layer 3 provided to the translucent substrate 1, and thus are positioned on the surface of the peripheral part of the translucent substrate 1 with the HR layer 3 in-between. The extended electrodes 16 are classified into extended first electrodes 16*a* electrically connected to the first electrode 5 and an extended second electrode 16*b* electrically connected to the second electrode 7. In the implemented embodiment, each extended electrode 16 is a part of the electrically conductive layer for forming the first electrode 5 which is extended towards the peripheral part of the translucent substrate 1 until the part is positioned outside a region on which the enclosing member 8 is placed. In more detail, the electrically conductive layer for forming the first electrode 5 includes end parts which are extended outside the enclosed region to be positioned on the surface of the HR layer 3 so as to serve as the extended first electrodes 16*a*. Further, parts separate from the electrically conductive layer for forming the first electrode 5 are extended outside the enclosed region to be positioned on the surface of the HR layer 3 so as to serve as the extended second electrodes 16*b*. Each extended second electrode 16*b* is in contact with the second electrode 7 formed above inside the enclosed region, and therefore each extended second electrode 16*b* and the second electrode 7 are electrically connected.

Note that, a structure of the extended electrode 16 (a structure for providing an electrode outside the enclosed region) is not limited to the structure shown in the implemented embodiment of FIG. 1. For example, at least one of the extended first electrode 16a and the extended second electrode 16b may be formed by use of an electrically conductive layer different from the electrically conductive layer for forming the first electrode 5.

In the organic EL element of the present implemented embodiment, the LR layer 2 and the HR layer 3 are interposed between the moisture-proof layer 1a and the first electrode 5 in this order. Further, the uneven structure 4 is formed in the interface between the LR layer 2 and the HR layer 3. A laminated structure of the LR layer 2 and the HR layer 3 defines a light-outcoupling structure. This light-outcoupling structure is a structure which is translucent and allows a large amount of light emitted by the organic light emitting layer 6 to emerge outside through the first electrode 5.

The LR layer 2 is a layer with a low refractive index. The LR layer 2 is also referred to as a low refractive index layer. The HR layer 3 is a layer with a high refractive index. The HR layer 3 is also referred to as a high refractive index layer.

The phrase that the LR layer 2 has a low refractive index means that the LR layer 2 has a refractive index lower than that of the HR layer 3, and the phrase that the HR layer 3 has a high refractive index means that the HR layer 3 has a refractive index higher than that of the LR layer 2. Therefore, the LR layer 2 may have a refractive index which is equal to or higher than a refractive index of the moisture-proof layer 1a. Alternatively, the LR layer 2 may have a refractive index lower than the refractive index of the moisture-proof layer 1a. Further, the HR layer 3 may have a refractive index which is equal to or lower than a refractive index of the first electrode 5. Alternatively, the HR layer 3 may have a refractive index higher than the refractive index of the first electrode 5. One example of preferable relations between refractive indices is a relation in which refractive indices increase in the order of the moisture-proof layer 1a, the LR layer 2, and the HR layer 3, the first electrode 5. In this relation, the refractive indices gradually increase and therefore the light-outcoupling efficiency can be improved. Further, it is preferable that the refractive index of the LR layer 2 be equal to or lower than the refractive index of the moisture-proof layer 1a. In this case, it is possible to more suppress total reflection at the interface between the translucent substrate 1 and the LR layer 2. In this case, for example, the refractive index of the LR layer 2 may be lower than the refractive index of the moisture-proof layer 1a, and the refractive indices may increase in the order of the LR layer 2, the HR layer 3, and the first electrode 5. Further, it is preferable that the refractive index of the HR layer 3 be equal to or higher than the refractive index of the first electrode 5. In this case, it is possible to more suppress total reflection at the interface between the first electrode 5 and the HR layer 3. In this case, for example, the refractive index of the LR layer 2 may be lower than the refractive index of the moisture-proof layer 1a, and the refractive index of the HR layer 3 may be higher than the refractive index of the first electrode 5.

To improve the light-outcoupling efficiency by reducing total reflection at interfaces between layers (the interface between the moisture-proof layer 1a and the LR layer 2 and the interface between the HR layer 3 and the first electrode 5), it is preferable to decrease differences between adjacent layers by making refractive indices of them be close to each other. Light emitted from the light emitting layer reaches directly the substrate or reaches the substrate after being reflected. However, when a difference at the interface between the substrate and the light emitting layer is large, an amount of light emerging outside is decreased due to total reflection caused by such a large difference. In contrast, when the light-outcoupling structure with a refractive index close to the refractive index of the first electrode 5 is provided as a layer under the first electrode 5 (layer allowing light to emerge outside), it is possible to obtain an effect similar to an effect obtained when a difference between the refractive indices of the first electrode 5 and the light-outcoupling structure is reduced, and therefore it is possible to improve the light-outcoupling efficiency. Further, when the refractive index of the LR layer 2 as a layer under the light-outcoupling structure is made to be close to the refractive index of the moisture-proof layer 1a, it is possible to obtain an effect similar to an effect obtained when a difference between the refractive indices thereof is reduced, and therefore it is possible to improve the light-outcoupling efficiency. The difference between refractive indices of adjacent layers (the moisture-proof layer 1a and the LR layer 2, or the HR layer 3 and the first electrode 5) is preferably smaller, and for example may be equal to or less than 0.1 or be equal to or less than 0.3, but is not limited to these examples. Note that, the uneven structure 4 is provided between the LR layer 2 and the HR layer 3, and the interfaces between the uneven structure 4 and the LR layer 2 and the HR layer 3 may cause scattering and diffusion of light, and therefore the difference between the refractive indices thereof may be present to some extent.

A difference between the refractive indices of the LR layer 2 and the HR layer 3 is not particularly limited, but may be equal to or more than 0.1, for example. The refractive index of the LR layer 2 is not particularly limited, but may be in a range of 1.4 to 1.7. The refractive index of the HR layer 3 is not particularly limited, but may be in a range of 1.6 to 2.0.

The refractive index of the moisture-proof layer 1a is not particularly limited but may be in a range of 1.4 to 1.6 when the moisture-proof layer 1a is made of glass material, for example. Further, the refractive index of the first electrode 5 is not particularly limited, but may be in a range of 1.6 to 2.2. However, a preferable range of the refractive index of the first electrode 5 may vary depending on material and forming methods. When the first electrode 5 is made of transparent metal oxide such as ITO, the refractive index of the first electrode 5 may be in a range of 1.7 to 2.0. In this case, adjustment of the refractive index is facilitated.

The light-outcoupling structure which is defined by the uneven structure 4 provided at the interface between the LR layer 2 and the HR layer 3 may be a lens array structure. The lens array structure means a structure in which fine protrusions are arranged in plane densely. Each protrusion of the lens array structure may have a semispherical shape, a fold shape, a pyramid shape (square pyramid shape), or the like. In the present implemented embodiment, the HR layer 3 provides a flat surface over the LR layer 2. By providing the flat surface, additional layers may be formed stably on the first electrode 5. Note that, the uneven structure 4 may be a diffraction structure. In the uneven structure 4, recesses and protrusions are arranged in plane randomly.

Further, a light-outcoupling functional part which is uneven, a light scattering layer, or the like may be provided to a surface of the translucent substrate 1 facing the outside. In this case, the light-outcoupling functional part is provided to the surface of the translucent substrate 1, and therefore the light-outcoupling efficiency can be improved easily. Further, a surface of the moisture-proof layer 1a facing the LR layer 2 may be uneven. In this case, the light-outcoupling efficiency can be more improved. However, to stably form layers, the surface of the moisture-proof layer 1a is preferably flat.

The LR layer 2 and the HR layer 3 may be made of resin. By using resin, adjustment of the refractive indices can be facilitated and recesses and protrusions can be easily provided to the interface between the LR layer 2 and the HR layer 3. The LR layer 2 and the HR layer 3 can be formed by applying a resin composition, for example. The resin preferably may be curable resin such as thermosetting resin and photocurable resin. Alternatively, the resin may be thermoplastic resin. The resin may be selected from acrylic resin, epoxy resin, phenol resin, and the like.

Further, at least one of the LR layer 2 and the HR layer 3 may be made of inorganic material. In this case, it is possible to easily form the uneven structure 4. The inorganic material may be selected from siloxane, titanoxane, and the like.

Further, at least one of the LR layer 2 and the HR layer 3 may be a plastic layer. The plastic layer may be provided by attaching a molded product (e.g., a sheet and film) prepared by molding synthetic resin as raw material of plastic and curing it. The plastic layer may be made of plastic material such as polyethylene terephthalate (PET) and polyethylene naphthalate (PEN). Alternatively, the plastic layer may be made of acrylic resin, epoxy resin, or the like. The forming method of plastic is not limited particularly but may be an appropriate forming method such as calendaring, rolling, and injection molding. In a case of using such a plastic layer, a base material of the plastic layer may be flexible preferably. When the base material is flexible, for example, it is possible to attach the plastic layer to the translucent substrate 1 by sending the rolled base material continuously, and therefore it is possible to easily attach the plastic layer. Further, when the base material is flexible, it is possible to produce a flexible element. When a sheet of plastic is used, the plastic layer can be provided by attaching the sheet of plastic. Attaching can be made by means of thermocompression or adhesive.

The refractive indices of the LR layer 2 and the HR layer 3 can be adjusted by an appropriate method such as designing material such as resin or inorganic material. For example, the refractive indices of the LR layer 2 and the HR layer 3 can be increased or decreased by dispersing and mixing low refractive index particles or high refractive index particles into these layers. The low refractive index particles may be exemplified by silica fine particles, for example. Especially, by using porous silica fine particles, it is possible to obtain a layer with a refractive index effectively decreased. The high refractive index particle may be resin particles of resin with a refractive index higher than a refractive index of a medium of a layer. The adjustment of the refractive index may be done by adding pores. As a larger number of pores are added, the refractive index is decreased. Note that, in a process of forming pores, if such pores contain oxygen or water, the element is likely to deteriorate. Hence, it is preferable that such pores do not contain oxygen or water. For example, it is preferable that the pores be filled with inactive gas (e.g., nitrogen).

It is preferable that the LR layer 2 and the HR layer 3 contain particles with light scattering properties. When they contain particles with light scattering properties, light entering the LR layer 2 and the HR layer 3 is scattered, and therefore it is possible to increase an amount of light emerging outside. It is preferable that the particles with light scattering properties be particles which are selected from the above low refractive index particles and the high refractive index particles and have a function of light scattering. In this case, the adjustment of the refractive index and providing the light scattering can be realized by the same particles. Therefore, it is possible to improve the light-outcoupling efficiency efficiently. According to the light-outcoupling structure constituted by the LR layer 2 and the HR layer 3, light is scattered due to reflection at an uneven interface or surfaces of particles, or reflection or refraction caused by a difference between refractive indices at an interface between different components, for example.

It is preferable that the light-outcoupling structure constituted by the LR layer 2 and the HR layer 3 extend from the central region on which the organic light emitting layer 6 is placed, to the outside of the enclosed region. Further, it is preferable that the uneven structure 4 be provide to cover the entire interface between the LR layer 2 and the HR layer 3. When the light-outcoupling structure is present, light produced by the organic light emitting layer 6 emerges outside from the translucent substrate 1 through the HR layer 3 and the LR layer 2. In this regard, if the light-outcoupling structure provided by the LR layer 2 and the HR layer 3 has light diffusion properties, light is diffused and thus some of rays of light travel towards the outer periphery. Diffusion of light at the LR layer 2 and the HR layer 3 may be effectively caused by providing the uneven structure 4. If the LR layer 2 and the HR layer 3 extend to the position at which the enclosing member 8 is bonded, or outward from this position, an amount of light traveling towards the outer peripheral part is likely to increase, and therefore light can emerge outside from a region which does not overlap the light emitting stack. Consequently, it is possible to reduce or eliminate a non-light emitting region at the outer peripheral part and thus to obtain the organic EL element with a high ratio of a light emitting area in a plane.

The uneven structure 4 between the LR layer 2 and the HR layer 3 can be formed by stacking the LR layer 2 and the HR layer 3 so that the interface therebetween is an uneven face. For example, in a case of stacking the LR layer 2 and the HR layer 3 sequentially, recesses and protrusions are formed in the surface of the LR layer 2 after the LR layer 2 is placed, or the LR layer 2 is formed so as to have an uneven surface, and thereafter the HR layer 3 is formed. By doing so, it is possible to easily form the uneven structure 4. Stacking of the LR layer 2 and the HR layer 3 can be made by application of resin. In case of making the uneven surface by forming recesses and protrusions, the uneven surface can be made by stamping with a stamper with recesses and protrusions. The uneven surface can be formed by imprint lithography. For example, photo imprint lithography allows efficient and easy formation of the uneven surface providing high light-outcoupling efficiency.

In a case of providing recesses and protrusions to the surface of the resin layer by use of material contained in the resin, by mixing particles with a size allowing provision of recesses and protrusions to the surface, it is possible to form recesses and protrusions derived from the particles. In this case, such particles may be particles for adjusting the refractive index or providing the light scattering properties. Alternatively, the LR layer 2 and the HR layer 3 may be stacked sheets. For example, by attaching sheets which are preliminarily stacked so that the interface between the LR layer 2 and the HR layer 3 is uneven, to the translucent substrate 1, it is possible to easily provide the LR layer 2 and the HR layer 3 simultaneously. Alternatively, after a sheet serving as the LR layer 2 may be attached, resin for the HR layer 3 may be applied. Alternatively, after resin for forming the LR layer 2 may be applied, a sheet serving as the HR layer 3 may be attached. In these cases, by use of a sheet with an uneven surface, it is possible to easily form the uneven structure 4.

In a case of forming the LR layer 2 and the HR layer 3 by application, an application method may be an appropriate method. For example, the application method may be spin coating, slit coating, or the like. Further, material may be applied by printing such as gravure printing and screen printing. In a case of printing, it is possible to apply the material in a desired pattern.

Further, in the organic EL element of the present implemented embodiment, when a linear expansivity of the moisture-proof layer 1a is represented by $\alpha$ and a linear expansivity of the LR layer 2 is represented by $\beta$ and a linear expansivity of the HR layer 3 is represented by $\gamma$, the linear expansivities of these layers satisfy a relation of $\alpha \leq \beta \leq \gamma$. When the linear expansivities (thermal expansivities in lengthwise directions) of the layers of interest fulfill the above condition, it is possible to suppress occurrence of cracks and the like in the layers of interest and other layers formed thereon. As a result, the organic electroluminescence element with high light emitting performance and high reliability can be obtained. Note that, the thermal expansivity in the lengthwise direction may be a linear expansivity in an in-plane direction (direction along a surface of a layer).

In the organic EL element, when thermal stresses in stacked two layers are different, cracks may easily occur. Especially, in the process of producing the organic EL element, after the light-outcoupling structure is formed, the electrodes and the organic layers may be formed while they have temperatures higher than the temperature of resin. Therefore, such a heating condition may cause cracks. However, in the present implemented embodiment, thermal expansivities (linear expansivity) are adjusted to satisfy the aforementioned condition. Therefore, heating in the process of producing the organic EL element is not likely to cause cracks. Consequently, it is possible to produce an element with excellent electric connectability and high reliability. Further, it is possible to disperse thermal stresses caused by heat in operation of the organic EL element, and therefore occurrence of cracks can be reduced and malfunction such as short-circuiting can be suppressed. In this regard, the LR layer 2 is a layer interposed between the moisture-proof layer 1a and the HR layer 3. Therefore, if the LR layer 2 has the relatively high thermal expansivity, it is considered that such a force that the LR layer 2 causes strain of the HR layer 3 may occur when heated, and thus cracks are likely to occur. Hence, it is considered that occurrence of cracks can be suppressed by setting the thermal expansivity of the LR layer 2 to a thermal expansivity between the thermal expansivities of the HR layer 3 and the moisture-proof layer 1a.

The linear expansivity of the moisture-proof layer 1a is not limited particularly, but may be equal to or more than 10 and less than 100 in terms of "$10^{-6} \times 1/°$ C.". Further, the linear expansivity of the LR layer 2 is not limited particularly, but may be equal to or more than 40 and less than 110 in terms of "$10^{-6} \times 1/°$ C.". Further, the linear expansivity of the HR layer 3 is not limited particularly, but may be equal to or more than 50 and less than 120 in terms of "$10^{-6} \times 1/°$ C.".

Differences between the linear expansivities of the layers are preferably smaller. Therefore, ideally, it is preferable that the relation of $\alpha = \beta = \gamma$ be satisfied. Even if this relation is not satisfied, it is preferable that the relation of $\alpha < \beta = \gamma$ or the relation of $\alpha = \beta < \gamma$ be satisfied. However, actually, the layers may be made of different materials, or even when the layers may be made of the same material, the layers are provided as a laminated structure and therefore the thermal expansivities of the stacked layers may differ from each other normally. In consideration of the above circumstances, to satisfy the relation of $\alpha < \beta < \gamma$ is practical and preferable. However, the LR layer 2 and the HR layer 3 can be made of similar materials and stacked in similar manners, and therefore the refractive indices of them can be easily adjusted to the same value. Consequently, to satisfy the relation of $\alpha < \beta \leq \gamma$ is also practical and preferable.

The differences between the linear expansivities of the layers are preferably smaller. In more detail, the differences between the linear expansivities can be set as follows. First, the difference between the linear expansivities of the moisture-proof layer 1a and the HR layer 3 is not limited particularly but may be equal to or more than 5 and less than 100 in terms of "$10^{-6} \times 1/°$ C.". Further, the difference between the linear expansivities of the moisture-proof layer 1a and the LR layer 2 is not limited particularly but may be equal to or more than 3 and less than 80 in terms of "$10^{-6} \times 1/°$ C.". Further, the difference between the linear expansivities of the LR layer 2 and the HR layer 3 is not limited particularly but may be equal to or more than 0 and less than 50 in terms of "$10^{-6} \times 1/°$ C.". The linear expansivity can be measured with a general-purpose measurement device such as TMA.

Adjustment of the linear expansivities is not limited particularly but may be done by an appropriate method. For example, in case where the moisture-proof layer in is made of glass, the linear expansivities of the LR layer 2 and the HR layer 3 are adjusted based on the linear expansivity of this glass. In case where the LR layer 2 and the HR layer 3 are made of resin materials, the linear expansivities thereof can be adjusted by selecting the resin materials and/or additives. Generally, the linear expansivity tends to decrease with an increase in the number of particles added. This is because particles are smaller in the expansivity than the resin in many cases. Especially, it is possible to decrease the expansivity by adding inorganic material such as inorganic particles and inorganic filler. Thus, for example, by adjusting a content of particles of the LR layer 2 to be larger than a content of particles of the HR layer 3, there is a possibility that the linear expansivity of the LR layer 2 is smaller than the linear expansivity of the HR layer 3.

In the organic EL element of the implemented embodiment of FIG. 1, the auxiliary electrode 10 having a mesh-like shape is provided to the surface of the first electrode 5. By providing the auxiliary electrode 10, it is possible to increase electric conductivity, and therefore it is possible to obtain the organic EL element with improved current distribution in the light emitting surface and more uniformed light emission in the plane. In this regard, the first electrode 5 is made of luminescent material (e.g., transparent metal oxide) and therefore normally has a relatively high specific resistance and thus shows poor electric conductivity. In view of this, by making an electrode wire of material higher in electric conductivity than the first electrode 5 and forming the auxiliary electrode 10 by use of the electrode wire, it is possible to compensate shortage of electric conductive properties of the first electrode 5 and improve the electric conductivity as a whole. Further, the auxiliary electrode 10 is formed on the surface of the first electrode 5. As described above, when the auxiliary electrode 10 is present, the auxiliary electrode 10 presses the HR layer 3 and the LR layer 2 with the first electrode 5 in-between, and therefore thermal expansion can be suppressed when heated, and consequently, occurrence of cracks can be more suppressed.

As shown in FIG. 2, in the present implemented embodiment, the auxiliary electrode 10 has a lattice shape. Such an auxiliary electrode 10 is referred to as a grid electrode. The auxiliary electrode 10 with a lattice shape can provide uniformed current distribution. This auxiliary electrode 10 with a lattice shape is constituted by straight wires which extend in a horizontal direction and a vertical direction and are arranged at regular intervals. In the implemented embodiment of FIG. 2, the five wires in the vertical direction and the five wires in the horizontal direction form a mesh with sixteen square openings. Note that, the number of wires is not limited to the above example, but each of the number of wires in the vertical direction and the number of wires in the horizontal direction may be an appropriate number in a range of 3 to 10.

The auxiliary electrode 10 is a layer made of electrode material. The auxiliary electrode 10 need not be transparent. The auxiliary electrode 10 may be made of electrically conductive metal material, for example. The electrically conductive metal material may be exemplified by copper, silver, gold, aluminum, nickel, and molybdenum. One of preferable materials of the auxiliary electrode 10 is a molybdenum/aluminum/molybdenum laminate (Mo/Al/Mo) which is so-called MAM. By use of MAM, it is possible to efficiently assist the electric conductive properties of the first electrode 5 and improve the electric conductivity as a whole. When the auxiliary electrode 10 is formed into a mesh shape, it is possible to allow light to emerge from the translucent substrate 1 by passing through intervals (openings) of the auxiliary electrode 10.

Normally, the auxiliary electrode 10 is not transparent. Therefore, the auxiliary electrode 10 does not allow light to pass, and therefore a non-light emitting region with a similar shape to the auxiliary electrode 10 may be formed. However, in the present implemented embodiment, light is diffused by the uneven structure 4 between the LR layer 2 and the HR layer 3, and therefore it is possible to diffuse light to a non-light emitting region formed by the auxiliary electrode 10. Consequently, the non-light emitting region can disappear or be made to not be perceived, and thus it is possible to realize more natural light emission.

Further, in the present implemented embodiment, an insulating film 11 is on a side of the auxiliary electrode 10 close to the organic light emitting layer 6. When the insulating film 11 is provided to the surface of the auxiliary electrode 10 in the aforementioned manner, the insulating film 11 presses the HR layer 3 and the LR layer 2 with the first electrode 5 in-between, and therefore thermal expansion can be suppressed when heated, and consequently, occurrence of cracks can be more suppressed. Further, the auxiliary electrode 10 exists as a protrusion on the surface of the first electrode 5. When the organic light emitting layer 6 and the second electrode 7 are directly formed on this surface, these layers may become discontinuous or thin, and consequently short-circuiting may easily occur. However, in the implemented embodiment of FIG. 1, the auxiliary electrode 10 is electrically insulated by the insulating film 11. Even when the second electrode 7 is formed on the auxiliary electrode 10, the insulating film 11 prevents direct contact between the auxiliary electrode 10 and the second electrode 7, and therefore short-circuiting between the auxiliary electrode 10 and the second electrode 7 can be prevented.

Normally, the auxiliary electrode 10 is not transparent. Therefore, a region on which the auxiliary electrode 10 is formed does not allow light to emerge. Hence, light emission at this region leads to loss of light emission, and thus the light emitting efficiency is likely to decrease. However, in the present implemented embodiment, the insulating film 11 is provided, and therefore light emission does not occur at the region on which the auxiliary electrode 10 is formed and a large amount of current is supplied to regions (corresponding to the openings of the mesh) which do not overlap the auxiliary electrode 10 but allow light to emerge. Consequently, it is possible to reduce light emission loss and improve the light emitting efficiency. Further, by providing the insulating film 11, it is possible to suppress excess light emission at the region covered with the auxiliary electrode 10.

Further, in the present implemented embodiment, a part of the auxiliary electrode 10 which is not in contact with the first electrode 5 is covered with the insulating film 11. In other words, the insulating film 11 is formed on the auxiliary electrode 10 so as to cover the auxiliary electrode 10, and therefore the surface as well as the sides of the auxiliary electrode 10 are covered with the insulating film 11. When the auxiliary electrode 10 is covered with the insulating film 11 in the aforementioned manner, it is possible to suppress discontinuation or breakage of the layer and to ensure the insulating properties. Hence, short-circuiting can be more suppressed. Further, it is possible to supply more current to regions which do not overlap the auxiliary electrode 10 but allow light to easily emerge, and thus the light emitting efficiency can be more improved. Further, the insulating film 11 is in contact with the surface of the first electrode 5, and therefore the HR layer 3 and the LR layer 2 can be more pressed by the insulating film 11 with the first electrode 5 in-between. Consequently, thermal expansion can be suppressed when heated, and occurrence of cracks can be more suppressed. It is preferable that the side faces of the insulating film 11 be inclined. In this case, it is possible to more suppress discontinuation of the layer.

In this regard, in the organic EL element of the present implemented embodiment, the HR layer 3 extends to the peripheral part and outside the enclosed region and thus is exposed outside. When the HR layer 3 is high moisture permeable, moisture may easily intrude inside through the HR layer 3. The exposed part of the HR layer 3 may be positioned at a region exposed by dividing the electrically conductive layer for forming the extended electrode 16 or a region on the peripheral part of the substrate. In view of this, it is preferable that a moisture-proof film covering the HR layer 3 be formed at the exposed part of the HR layer 3. This is because it is possible to suppress intrusion of moisture into the inside through the HR layer 3. Similarly, when the LR layer 2 has an exposed part, it is preferable that a moisture-proof film be formed to cover the LR layer 2. For example, the moisture-proof film may be formed on the side face of the translucent substrate 1 or the like. The moisture-proof film may be made of inorganic material, for example. The inorganic material may be exemplified by silica, for example.

In the implemented embodiment of FIG. 1, the auxiliary electrode 10 is formed as a layer above the first electrode 5. However, the auxiliary electrode 10 may be formed as a layer under the first electrode 5. In this case, the auxiliary electrode 10 is in contact with the first electrode 5, and therefore the auxiliary electrode 10 can increase an amount of current flowing through the first electrode 5. In this case, to suppress light emission at the region covered with the auxiliary electrode 10, it is preferable that the insulating film 11 is situated between the first electrode 5 and the second electrode 7 to overlap the auxiliary electrode 10.

FIG. 1 illustrates the implemented embodiment including the auxiliary electrode 10 and the insulating film 11. However, the organic EL element may be devoid of the auxiliary electrode 10 and the insulating film 11. Also in this case, the linear expansivities are set as described above, and thus occurrence of cracks can be suppressed.

Figure 3:
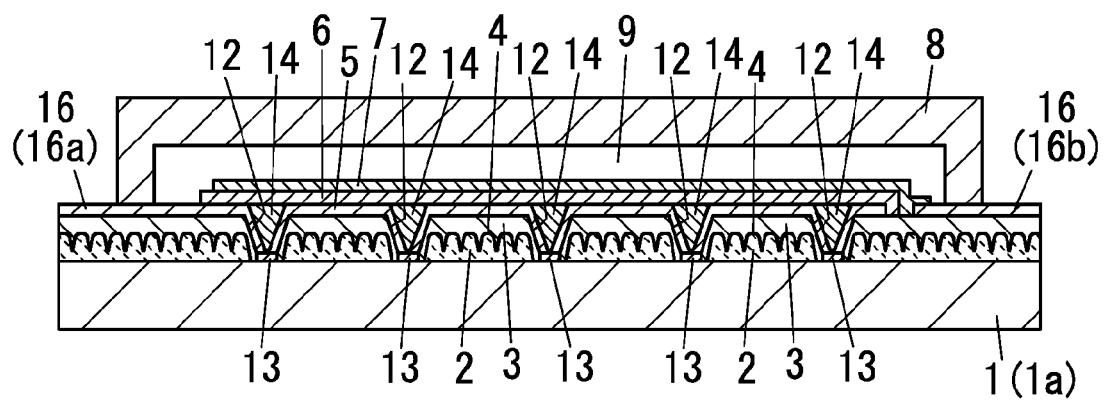
FIG. 3 is a section illustrating an example of the embodiment of the organic electroluminescence element.

FIG. 3 shows an example of the embodiment of the organic EL element, and components thereof same as those of the implemented embodiment of FIG. 1 are designated by the same reference signs and explanations thereof are omitted.

The organic EL element of FIG. 3 includes a translucent substrate 1, a first electrode 5 with light transmissive properties, an organic light emitting layer 6, and a second electrode 7, and the first electrode 5, the organic light emitting layer 6, and the second electrode 7 are stacked on the translucent substrate 1 in this order, as with the implemented embodiment of FIG. 1. The translucent substrate 1 includes a moisture-proof layer 1a facing the first electrode 5. The organic EL element includes a LR layer 2 and a HR layer 3 having a refractive index higher than a refractive index of the LR layer 2 which are situated between the moisture-proof layer 1a and the first electrode 5 in this order from the moisture-proof layer 1a. The organic EL element includes an uneven structure 4 provided at an interface between the LR layer 2 and the HR layer 3. As described above, the LR layer 2 which is a layer with a low refractive index is placed adjacent to the translucent substrate 1, and the HR layer 3 which is a layer with a high refractive index is placed adjacent to the first electrode 5, and therefore a difference between refractive indices is reduced and thus total reflection is suppressed, and consequently it is possible to increase an amount of light emerging outside. Further, the uneven structure 4 is provided at the interface between the LR layer 2 and the HR layer 3, and therefore light is scattered by this uneven structure 4, and consequently it is possible to reduce total reflection loss and thus to more improve the light-outcoupling efficiency.

Further, also in the organic EL element of the present implemented embodiment, when a linear expansivity of the moisture-proof layer 1a is represented by $\alpha$ and a linear expansivity of the LR layer 2 is represented by $\beta$ and a linear expansivity of the HR layer 3 is represented by $\gamma$, the linear expansivities of these layers satisfy a relation of $\alpha \leq \beta \leq \gamma$. When the linear expansivities (thermal expansivities in lengthwise directions) of these layers fulfill the above condition, it is possible to suppress occurrence of cracks in these layers and other layers above these layers. As a result, the organic electroluminescence element with high light emitting performance and high reliability can be obtained.

Hereinafter, it is assumed that FIG. 2 shows a plan view of the organic EL element of the implemented embodiment of FIG. 3 (i.e., a representation when viewed in a direction perpendicular to the surface of the translucent substrate 1). In view of this, FIG. 3 shows a section along line (i)-(i) in FIG. 2. Further, broken lines represent an auxiliary wire 13 which is not exposed.

In a preferable implemented embodiment, the organic EL element further includes a groove region 12 dividing at least the HR layer 3. When the groove region 12 dividing the HR layer 3 is present, the layer has been divided, and therefore thermal expansion caused by heat is relieved by the groove region 12, and stress caused by thermal expansion can be reduced. Consequently, cracks are suppressed from occurring, and thus the element with high reliability can be obtained. The groove region 12 is formed in the laminated structure including the LR layer 2 and the HR layer 3. The groove region 12 is provided to divide at least the HR layer 3. When the HR layer 3 has been divided, the thermal expansion of the HR layer 3 can be relieved by the groove region 12.

The groove region 12 may be formed by an appropriate method. For example, the groove region 12 may be formed, in a process of forming the LR layer 2 and the HR layer 3, by patterning the desired layer. Alternatively, for example, the groove region 12 may be formed by forming the LR layer 2 and the HR layer 3 without the groove region 12 and thereafter removing a part to form the groove region 12 by at least one of a physical method and a chemical method. Alternatively, for example, the groove region 12 may be formed by exerting stress on the LR layer 2 and the HR layer 3 to cause at least one crack, and in this case the at least one crack may serve as the groove region 12.

The groove region 12 may be constituted by a plurality of straight grooves. For example, the groove region 12 is constituted by grooves extending in a horizontal direction and grooves extending in a vertical direction. As a whole, the groove region 12 may have a mesh-like shape, a grid-shape, or a lattice shape. When the auxiliary wire 13 is present, the groove region 12 may have a shape corresponding to the shape of the auxiliary wire 13.

It is preferable that a width of the groove region 12 is smaller. Consequently, the larger area of the light-outcoupling structure can be ensured. The width of the groove region 12 is defined as a width of one of the grooves constituting the groove region 12 (a dimension of a groove in a direction perpendicular to a dimension in which the groove extends in a plan view). The width of the groove region 12 is preferably equal to or less than 100 μm. The width of the groove region 12 is more preferably equal to or less than 10 μm. The lower limit of the width of the groove region 12 is not limited particularly but the width of the groove region 12 may be equal to or more than 0.1 μm, for example. It is preferable that an interval of the groove region 12 which means a distance between adjacent grooves of the groove region 12 be larger. Consequently, the larger area of the light-outcoupling structure can be ensured. The interval of the groove region 12 is preferably equal to or more than 1 mm. The interval of the groove region 12 is more preferably equal to or more than 2 mm. The upper limit of the interval of the groove region 12 is not limited particularly but the interval of the groove region 12 may be equal to or less than 10 mm, for example. Note that, preferable values of the width of the groove region 12 and the interval of the groove region 12 may vary depending on the material and the processing method of the light-outcoupling structure, and therefore are not limited to aforementioned ranges.

It is preferable that the groove region 12 divide both the LR layer 2 and the HR layer 3. In the present implemented embodiment, the groove region 12 divides not only the HR layer 3 but also the LR layer 2. In other words, the groove region 12 cuts the HR layer 3 in a thickness direction of the HR layer 3 to divide the HR layer 3 in a direction along the surface of the HR layer 3, and also cuts the LR layer 2 in a thickness direction of the LR layer 2 to divide the LR layer 2 in a direction along the surface of the LR layer 2. A bottom of the groove region 12 reaches the surface of the translucent substrate 1 (the moisture-proof layer 1a). When such a groove region 12 is present, the two layers are each divided, and therefore thermal expansion caused by heat is relieved by the groove region 12, and thus stress caused by the thermal expansion can be reduced. Consequently, cracks can be suppressed from occurring and it is possible to obtain the element with high reliability. Further, provision of the groove region 12 allows suppressing defect caused by cracks, producing a large size element which is likely to be cracked, and producing a flexible element.

It is preferable that the groove region 12 become smaller in width toward its bottom than at its top. In this case, side faces of the groove region 12 are inclined faces which are inclined relative to the surface of the translucent substrate 1, and therefore the side faces of the groove region 12 do not face each other in parallel. The width of the groove region 12 at its opening is larger than that at its bottom. Therefore, when the layer expands by heat, it is possible to relieve stress at the peripheral parts where stress tends to concentrate, and thus it is possible to suppress cracks from occurring due to heat. Further, even if thermal expansion causes such deformation of narrowing the grooves of the groove region 12, the groove region 12 becomes smaller in width toward its bottom than at its top and therefore stress caused by heat can be relieved and deformation can be suppressed. Consequently, it is possible to suppress cracks from occurring. Note that, in a case where the side face of the groove region 12 is perpendicular to the surface of the translucent substrate 1, a stepped part exists. In this case, when the layer is formed, the layer may be divided at this stepped part, and this may lead to a decrease in the reliability of connection. However, when the groove region 12 becomes smaller in width toward its bottom than at its top and thus the side faces of the groove region 12 are inclined faces which are inclined relative to the surface of the translucent substrate 1, discontinuation of the layer at the stepped part can be suppressed and the reliability of connection can be improved. The groove region 12 with such a shape can be called a groove with a fillet shape. Note that, at a periphery of the opening of the groove region 12 (i.e., a border between the surface and the side face), corners of the HR layer 3 may be rounded to have curved surfaces. In this case, angled parts are cut away and thus discontinuation of the layer can be more suppressed.

In the present implemented embodiment, the auxiliary wire 13 is provided inside the groove region 12. The material and shape of the auxiliary wire 13 may be the same as those of the auxiliary electrode 10 of the implemented embodiment of FIG. 1. In short, the auxiliary wire 13 may be a grid wire. By providing the auxiliary wire 13, it is possible to increase electric conductivity, and therefore it is possible to obtain the organic EL element with improved current distribution in the light emitting surface and more uniformed light emission in the plane. The first electrode 5 is made of luminescent material (e.g., transparent metal oxide) and therefore normally has a relatively high specific resistance and thus shows poor electric conductivity. In view of this, by making a wire of material higher in electric conductivity than the first electrode 5 and forming the auxiliary wire 13 by use of this wire, it is possible to compensate shortage of electric conductive properties of the first electrode 5 and improve the electric conductivity as a whole. To increase an amount of current flowing through the first electrode 5, the auxiliary wire 13 is situated in contact with the first electrode 5. Further, the auxiliary wire 13 is situated inside the groove region 12. As described above, the auxiliary wire 13 is provided to the groove region 12. It is possible to provide the auxiliary wire 13 by use of the groove region 12 set back from the surface of the translucent substrate 1, and therefore the auxiliary wire 13 can be provided efficiently. Further, when the groove region 12 is present, the grooves thereof may cause division of the first electrode 5 and an increase in a distance between electrodes, and therefore power supply may become unstable. By providing the auxiliary wire 13 to the groove region 12, it is possible to situate the first electrode 5 on the auxiliary wire 13. Hence, it is possible to obtain the element enabling stable power supply.

Generally, an increase in the area of the light emitting surface may increase a possibility of shortage of power supply to the center or near center of the light emitting surface. This is because the electrode layer with translucent properties has a relatively high resistance. However, provision of the auxiliary wire 13 can allow stable power supply to the center or near center of the light emitting surface. Therefore, it is possible to easily increase the area of the light emitting element. This advantageous effect can be also obtained by the auxiliary electrode 10.

As shown in FIG. 3, the auxiliary wire 13 is situated on the bottom of the groove region 12, and thus is in contact with the surface of the translucent substrate 1 (the moisture-proof layer 1a). As described above, when the auxiliary wire 13 is situated on the bottom of the groove region 12, it is possible to provide the auxiliary wire 13 more efficiently.

As shown in FIG. 2, the auxiliary wire 13 may have a mesh-like shape, and more preferably have a lattice shape. The auxiliary wire 13 with a lattice shape can provide uniformed current distribution. This auxiliary wire 13 with a lattice shape is constituted by straight wires which extend in a horizontal direction and a vertical direction and are arranged at regular intervals. The mesh pattern may be similar to that described with regard to the implemented embodiment of FIG. 1.

The auxiliary wire 13 is a layer made of electrode material. The auxiliary wire 13 need not be transparent. The auxiliary wire 13 may be made of electrically conductive metal material, for example. The electrically conductive metal material may be exemplified by copper, silver, gold, aluminum, nickel, and molybdenum. MAM may be preferable as material of the auxiliary wire 13. By use of Mo/Al/Mo, it is possible to efficiently assist the electric conductive properties of the first electrode 5 and improve the electric conductivity as a whole. When the auxiliary wire 13 is formed into a mesh shape, it is possible to allow light to emerge from the translucent substrate 1 by passing through intervals (openings) of the auxiliary wire 13.

Further, it is preferable that the thickness of the auxiliary wire 13 be equal to or less than a depth of the groove region 12. When the thickness of the auxiliary wire 13 is more than the depth of the groove region 12, the auxiliary wire 13 protrudes outside from the opening of the groove region 12, and therefore it may be difficult to perform stable film formation. Further, when the auxiliary wire 13 is formed so that the groove region 12 is filled with the auxiliary wire 13 entirely and the auxiliary wire 13 protrudes from the groove region 12, it becomes difficult to relieve stress, and cracks may not be suppressed effectively from occurring. In contrast, when the thickness of the auxiliary wire 13 is equal to or less than a depth of the groove region 12, the electric reliability can be maintained and cracks can be efficiently suppressed from occurring.

When the groove region 12 is a groove dividing both the HR layer 3 and the LR layer 2, the auxiliary wire 13 may have a thickness equal to or less than the thickness of the LR layer 2. When the thickness of the auxiliary wire 13 becomes smaller, discontinuation of the layer can be suppressed and stress caused by thermal expansion can be relieved. Note that, in this regard, the thickness of the LR layer 2 may mean an average thickness. Further, the thickness of the auxiliary wire 13 may be smaller than a thickness of the thinnest part of the LR layer 2.

In the present implemented embodiment, it is preferable that an insulating part 14 is provided inside the groove region 12 so as to be closer to the second electrode 7 than the auxiliary wire 13 is. The groove region 12 is formed so as to divide at least one of the HR layer 3 and the LR layer 2. Hence, when the first electrode 5, the organic light emitting layer 6 and the second electrode 7 are stacked directly inside the groove region 12, these layers may become discontinuous or thin, and consequently short-circuiting may easily occur. However, in a case where the insulating part 14 is provided on a side of the auxiliary wire 13 facing the second electrode 7, the groove region 12 is filled with the insulating part 14, and therefore it is possible to suppress discontinuation of the layers. Further, the auxiliary wire 13 is electrically insulated by the insulating part 14. Even when the second electrode 7 is formed on the auxiliary wire 13, the insulating part 14 prevents direct contact between the auxiliary wire 13 and the second electrode 7, and therefore short-circuiting between the auxiliary wire 13 and the second electrode 7 can be prevented. Normally, the auxiliary wire 13 is not transparent. Therefore, a region on which the auxiliary wire 13 is formed does not allow light to emerge. Hence, light emission at this region leads to loss of light emission, and thus the light emitting efficiency is likely to decrease. However, in the present implemented embodiment, the insulating part 14 is provided, and therefore light emission does not occur at the region on which the auxiliary wire 13 is formed and a large amount of current is supplied to regions (corresponding to the openings of the mesh) which do not overlap the auxiliary wire 13 but allow light to emerge. Consequently, it is possible to reduce light emission loss and improve the light emitting efficiency. Further, by providing the insulating part 14, it is possible to suppress excess light emission at the region covered with the auxiliary wire 13.

It is preferable that the insulating part 14 be provided to fill up the groove region 12. When the groove region 12 is filled with the insulating part 14, it is possible to form layers stably. Especially, when the groove region 12 is filled with the insulating part 14 so that the surface of the first electrode 5 before the organic light emitting layer 6 is formed is not uneven but is flat, it is possible to stably form the organic light emitting layer 6, and therefore to obtain the element with high reliability.

The insulating part 14 is situated above the first electrode 5. Therefore, it is possible to ensure electric conduction between the first electrode 5 and the auxiliary wire 13. Note that, a place where the insulating part 14 is situated is not limited to the above example, but the insulating part 14 may be situated between the organic light emitting layer 6 and the second electrode 7.

In the implemented embodiment of FIG. 3, the auxiliary wire 13 is formed as a layer under the first electrode 5. However, the auxiliary wire 13 may be formed as a layer above the first electrode 5. In this case, the auxiliary wire 13 is in contact with the first electrode 5, and therefore the auxiliary wire 13 can increase an amount of current flowing through the first electrode 5.

Figure 4:
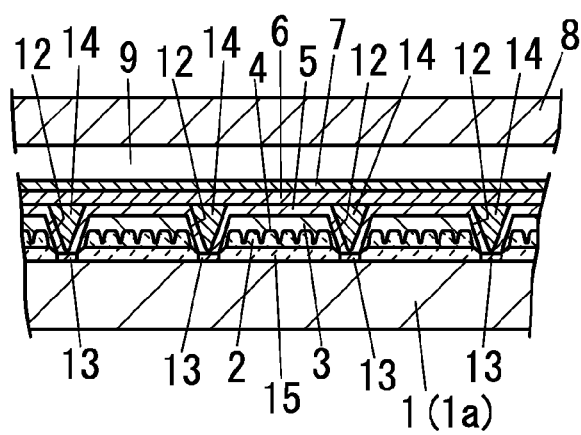
FIG. 4 is a partial section illustrating an example of the embodiment of the organic electroluminescence element.

FIG. 4 shows another example of the implemented embodiment of the organic EL element, and components thereof same as those of the above implemented embodiment are designated by the same reference signs and explanations thereof are omitted. The present implemented embodiment is different from the implemented embodiment of FIG. 3 in that an insulating layer 15 is situated between the moisture-proof layer 1a and the LR layer 2, but the other components are the same as those of FIG. 3.

In the implemented embodiment of FIG. 4, the insulating layer 15 is provided, and therefore stress caused by thermal expansion can be more relieved. The groove region 12 divides the HR layer 3, the LR layer 2 and the insulating layer 15, and the auxiliary wire 13 is situated as the bottom of the groove region 12 to be on the surface of the moisture-proof layer 1a. It is preferable that the auxiliary wire 13 be thinner than the insulating layer 15. As thinner the auxiliary wire 13 becomes, the more discontinuation of layers can be suppressed.

In the organic EL element of the present implemented embodiment, when a linear expansivity of the moisture-proof layer 1a is represented by α and a linear expansivity of the insulating layer 15 is represented by σ and a linear expansivity of the LR layer 2 is represented by β and a linear expansivity of the HR layer 3 is represented by γ, it is preferable that the linear expansivities of these layers satisfy a relation of $\alpha \leq \sigma \leq \beta \leq \gamma$. When the linear expansivities (thermal expansivities in lengthwise directions) of these layers fulfill the above condition, it is possible to suppress occurrence of cracks in these layers and other layers above these layers. As a result; the organic electroluminescence element with high light emitting performance and high reliability can be obtained.

The insulating layer 15 may be made of resin material or inorganic material. In a case of using resin, such resin may be the same as resin used for the LR layer 2 and the HR layer 3. In a case of using inorganic material, such inorganic material may be silica-based inorganic material or the like. A refractive index of the insulating layer 15 is not limited particularly. However, in order to improve the light-outcoupling efficiency, the refractive index of the insulating layer 15 may be between refractive indices of the moisture-proof layer 1a and the LR layer 2, for example.

FIGS. 3 and 4 each illustrate the implemented embodiment including the auxiliary wire 13 and the insulating part 14. However, the organic EL element may be devoid of the auxiliary wire 13 and the insulating part 14. Also in this case, the linear expansivities are set as described above, and thus occurrence of cracks can be suppressed. Further, the groove region 12 is provided, and therefore stress caused by expansion due to heating can be relieved and thus effects of suppressing occurrence of cracks can be improved more.

Note that, it is possible to produce the organic EL element in which the auxiliary electrode 10 is situated on the surface of the first electrode 5 and the auxiliary wire 13 is situated inside the groove region 12.

Hereinafter, methods of producing the organic EL element are described. FIGS. 5(a) to 5(g) illustrate an example of a process of producing the organic EL element of the implemented embodiment of FIG. 1.

Figure 5:
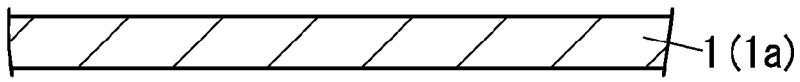
FIGS. 5(a) to 5(g) are sections relating to an example of a process of producing the organic electroluminescence element.
Figure 5:
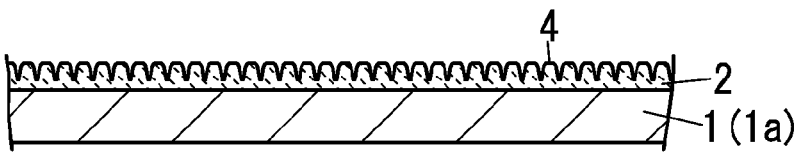
Figure 5:
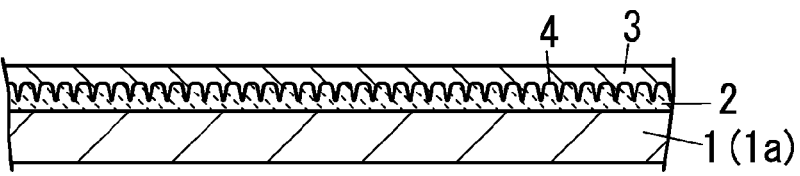
Figure 5:
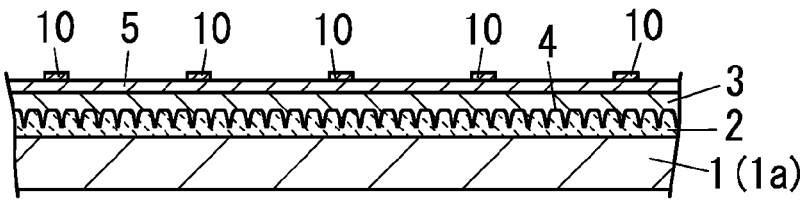
Figure 5:
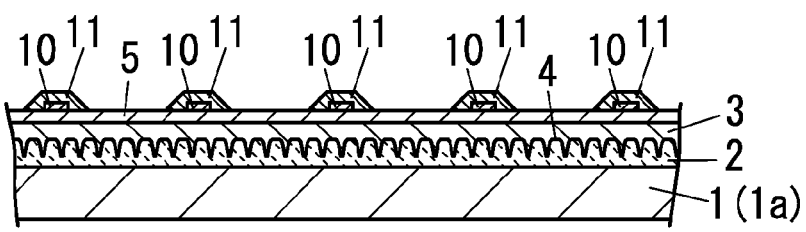
Figure 5:
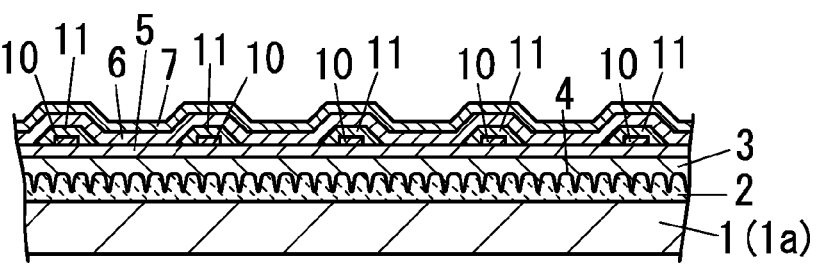
Figure 5:
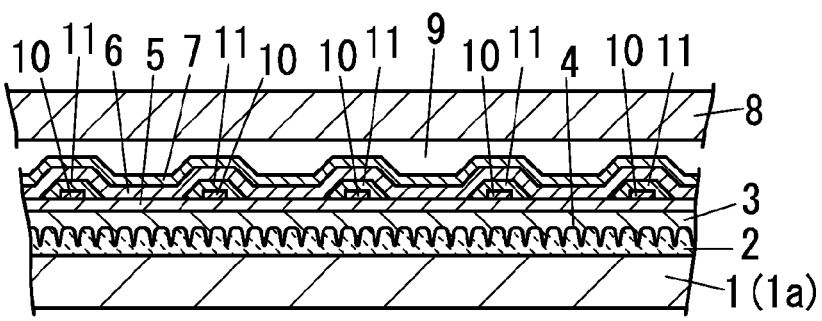

In the process of producing the organic EL element, first, as shown in FIG. 5(a), the translucent substrate 1 including the moisture-proof layer 1a is prepared. Next, as shown in FIG. 5(b), the LR layer 2 is formed on the surface of the moisture-proof layer 1a. Formation of the LR layer 2 may be done by applying material (resin material or inorganic material) for forming the LR layer 2. For example, such application can be done by spin coating, slit coating, printing, or the like. Alternatively, the LR layer 2 may be formed by disposition. Subsequently, the surface of the LR layer 2 is made to be an uneven surface. The uneven surface may be formed by imprint lithography. By use of photo imprint lithography, it is possible to easily form recesses and protrusions. Alternatively, such recesses and protrusions may be made with a stamper with recesses and protrusions. Alternatively, light scattering fine particles may be dispersed to form recesses and protrusions derived from such fine particles. In this regard, the material of the LR layer 2 is higher in linear expansivity than the moisture-proof layer 1a.

Thereafter, as shown in FIG. 5(c), the HR layer 3 is formed on the surface (uneven surface) of the LR layer 2. Formation of the HR layer 3 may be done by applying material (resin material or inorganic material) for forming the HR layer 3. For example, such application can be done by spin coating, slit coating, printing, or the like. As a result of forming the HR layer 3, the uneven structure 4 is present at the interface between the LR layer 2 and the HR layer 3. Note that, the LR layer 2 and the HR layer 3 may be provided by use of a plastic sheet. For example, by attaching a plastic sheet in which the LR layer 2 and the HR layer 3 are stacked, it is possible to situate the LR layer 2 and the HR layer 3 on the surface of the translucent substrate 1 simultaneously. Alternatively, after a sheet serving as the LR layer 2 may be attached, the HR layer 3 may be formed by application. Alternatively, after the LR layer 2 may be formed by application, a sheet serving as the HR layer 3 may be attached. In these cases, the uneven structure 4 may be formed by use of a sheet with an uneven surface. In this regard, the material of the HR layer 3 is higher in linear expansivity than the LR layer 2.

Subsequently, as shown in FIG. 5(d), the first electrode 5 is formed on the surface of the HR layer 3 and the auxiliary electrode 10 is formed on the first electrode 5. Formation of the first electrode 5 and the auxiliary electrode 10 may be done by deposition, sputtering, coating, or the like. In a case of deposition, it is possible to easily form electrode layers with high electric conductivity. In the formation of the first electrode 5 and the auxiliary electrode 10, layers therefor are patterned. In more detail, the layer for the first electrode 5 is patterned in order to provide the extended electrodes 16 on the peripheral part of the substrate. Further, the layer for the auxiliary electrode 10 is patterned in order to obtain an electrode with a mesh-like shape. Formation of such patterned layers may be done by deposition with masks, or patterning by etching layers formed on the entire surface. Note that, the auxiliary electrode 10 may be provided by attaching an electric conductive molded product with a mesh-like shape.

After that, as shown in FIG. 5(e), the insulating film 11 is formed on the auxiliary electrode 10 to cover the auxiliary electrode 10. Formation of the insulating film 11 may be done by applying material for forming the insulating film 11. For example, such application can be done by spin coating, slit coating, printing, or the like. In a case of using thermosetting material, the insulating film 11 is formed by thermally curing the thermosetting material by heat.

Next, as shown in FIG. 5(f), the organic light emitting layer 6 and the second electrode 7 are stacked sequentially. The organic light emitting layer 6 may be formed by sequentially stacking layers constituting the organic light emitting layer 6 by deposition or coating. The second electrode 7 may be formed by deposition, sputtering, coating, or the like. In the process of stacking the organic light emitting layer 6 and the second electrode 7, the organic light emitting layer 6 and the second electrode 7 are extended outside from the first electrode 5 to a place where the extended second electrode 16b is provided, so as to electrically connect an extended part of the second electrode 7 to the extended second electrode 16b. By doing so, it is possible to electrically interconnect the electrodes without causing short-circuit.

In the processes of forming the first electrode 5, the auxiliary electrode 10, the insulating film 11, the organic light emitting layer 6 and the second electrode 7, they may be heated in disposition or the like in some cases. Further, with regard to application, heated compositions may be applied, or heating may be conducted in order to thermally curing. For example, a temperature for heating may be equal to or more than 100° C. and equal to or less than 200° C. In this regard, when the linear expansivities does not satisfy a relation of $\alpha \le \beta \le \gamma$ and for example the linear expansivities satisfy a relation of $\alpha < \gamma < \beta$ or the like, there are considerable differences between expansivities, and therefore at least one of the HR layer 3 and the LR layer 2 are likely to be easily cracked when heated. However, in the present implemented embodiment, the linear expansivities of the moisture-proof layer 1a, the LR layer 2 and the HR layer 3 satisfy the relation of $\alpha \le \beta \le \gamma$. Hence, even if heating is conducted in a process of stacking the layers, occurrence of cracks can be suppressed.

Finally, as shown in FIG. 5(g), the enclosing member 8 is bonded to the translucent substrate 1 so that the enclosing member 8 encloses a laminate (the light emitting stack) including the organic light emitting layer 6. In enclosing by the enclosing member 8, adhesive for enclosing is provided on the surface (may include part of the surface of the HR layer 3) of the extended electrode 16 at the outer peripheral part of the translucent substrate 1 so as to surround the outer periphery of the light emitting stack. Thereafter, the enclosing member 8 is made closer to the surface of the translucent substrate 1 facing the light emitting stack, and the translucent substrate 1 and the enclosing member 8 are bonded with the adhesive to enclose the light emitting stack.

By performing the above process, it is possible to obtain the organic EL element of the implemented embodiment of FIG. 1. According to the method of producing shown in FIGS. 5(a) to 5(g), the linear expansivities of the stacked layers are adjusted, and therefore cracks can be suppressed from occurring. Further, the auxiliary electrode 10 is formed and this auxiliary electrode 10 is covered with the insulating film 11, and therefore current distribution can be improved, and consequently it is possible to obtain the organic EL element with uniform light emission in plane. Note that, when the auxiliary electrode 10 and the insulating film 11 are unnecessary, processes of forming them may be omitted from the process shown in FIGS. 5(a) to 5(g).

FIGS. 6(a) to 6(g) illustrate an example of a process of producing the organic EL element of the implemented embodiment of FIG. 3.

Figure 6:
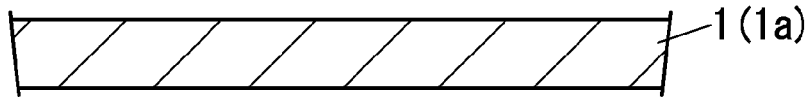
FIGS. 6(a) to 6(g) are sections relating to an example of a process of producing the organic electroluminescence element.
Figure 6:
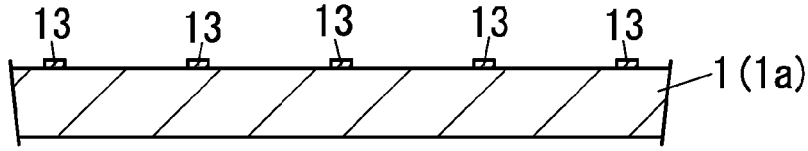
Figure 6:
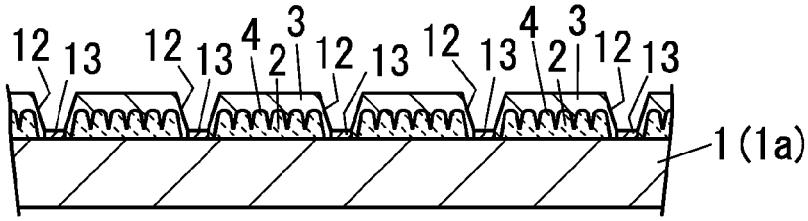
Figure 6:
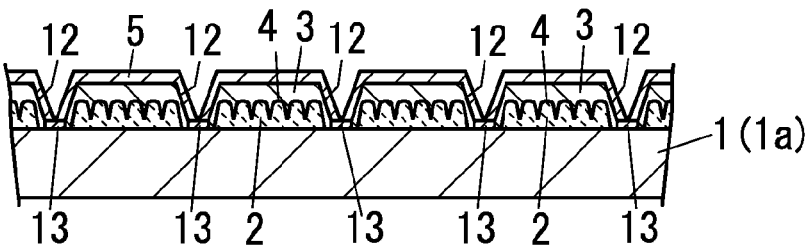
Figure 6:
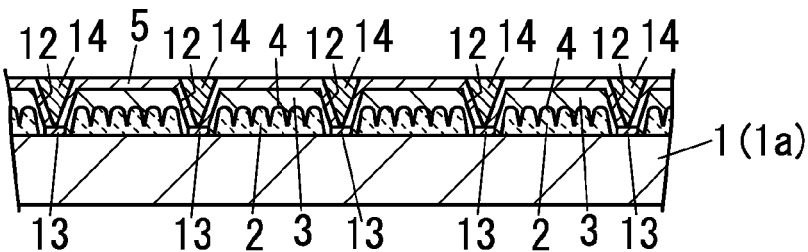
Figure 6:
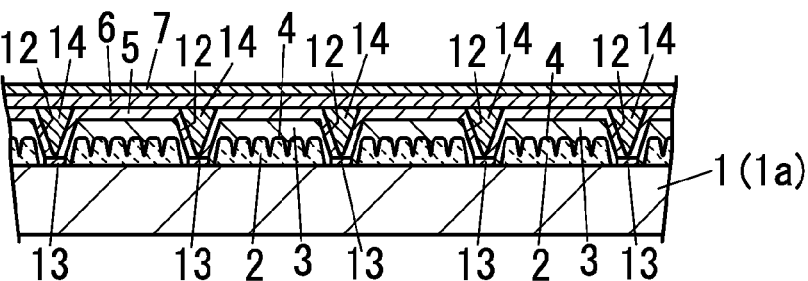
Figure 6:
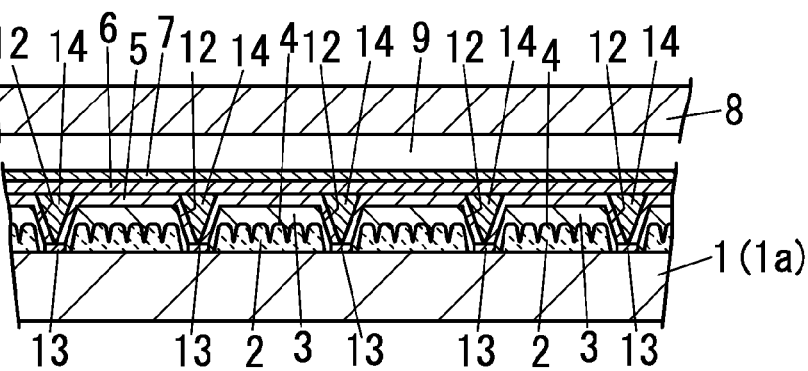

In the process of producing the organic EL element, first, as shown in FIG. 6(a), the translucent substrate 1 including the moisture-proof layer 1a is prepared. Next, as shown in FIG. 6(b), the auxiliary wire 13 is formed on the surface of the translucent substrate 1. The auxiliary wire 13 may be formed by the same method as the auxiliary electrode 10 of the implemented embodiment of FIGS. 5(a) to 5(g).

Thereafter, as shown in FIG. 6(c), the LR layer 2 and the HR layer 3 are formed on parts of the surface of the moisture-proof layer 1a which are not covered with the auxiliary wire 13. The LR layer 2 and the HR layer 3 may be stacked by the same method as the implemented embodiment of FIGS. 5(a) to 5(g). However, to form the groove region 12, materials on the LR layer 2 and the HR layer 3 are applied in such patterns that the auxiliary wire 13 is not covered with the LR layer 2 and the HR layer 3. Application of materials in such patterns may be done by spin coating, slit coating, or the like with masks. To form the side faces of the groove region 12 as inclined faces, layers are stacked to have inclined faces, or edge parts of stacked layers are cut away to form inclined surface. Alternatively, the LR layer 2 and the HR layer 3 may be formed on the surface of the translucent substrate 1, and thereafter the LR layer 2 and the HR layer 3 may be partially removed by irradiation with a laser to form the groove region 12, and the auxiliary wire 13 may be formed inside this groove region 12. Also in this case, as shown in FIG. 6(c), it is possible to obtain the implemented embodiment in which the groove region 12 is formed as a result of division of the LR layer 2 and the HR layer 3 and the auxiliary wire 13 is formed inside the groove region 12. Note that, in a case of irradiation with a laser, it is possible to make the side faces of the groove region 12 be inclined faces by adjusting an angle of a laser beam, and thus the inclined faces can be easily formed.

Subsequently, as shown in FIG. 6(d), the first electrode 5 is formed. Formation of the first electrode 5 may be done by deposition, sputtering, coating, or the like. In this process, parts of the first electrode 5 are formed inside the groove region 12 so that the first electrode 5 is in contact with the auxiliary wire 13 to make connection therebetween. By doing so, electric conduction between the first electrode 5 and the auxiliary wire 13 is made, and it is possible to enhance assistance of electric conduction.

After that, as shown in FIG. 6(e), insulating material is deposited over the auxiliary wire 13 to fill up the groove region 12 by coating, deposition, or the like, so as to form the insulating part 14. It is preferable that the insulating part 14 be formed so that the groove region 12 is filled and the surface of the insulating part 14 is flush with the surface of the first electrode 5 to give a flat surface. In this case, it is possible to stably form layers on the insulating part 14 and the first electrode 5.

Next, as shown in FIG. 6(f), the organic light emitting layer 6 and the second electrode 7 are stacked sequentially, and thereafter, as shown in FIG. 6(g), the enclosing member 8 is bonded to the translucent substrate 1 so that the enclosing member 8 encloses the laminate (the light emitting stack) including the organic light emitting layer 6. Formation of the organic light emitting layer 6 and the second electrode 7 and bonding of the enclosing member 8 may be done by the same method as the implemented embodiment of FIGS. 5(a) to 5(g).

In the processes of forming the first electrode 5, the organic light emitting layer 6 and the second electrode 7, they may be heated in deposition or the like in some cases. Further, with regard to application, heated compositions may be applied, or heating may be conducted in order to thermally curing. For example, a temperature for heating may be equal to or more than 100° C. and equal to or less than 200° C. In this regard, when the linear expansivities does not satisfy a relation of $\alpha \leq \beta \leq \gamma$ and for example the linear expansivities satisfy a relation of $\alpha < \gamma < \beta$ or the like, there are considerable differences between expansivities, and therefore at least one of the HR layer 3 and the LR layer 2 are likely to be easily cracked when heated. However, in the present implemented embodiment, the linear expansivities of the moisture-proof layer 1a, the LR layer 2 and the HR layer 3 satisfy the relation of $\alpha \leq \beta \leq \gamma$. Hence, even if heating is conducted in a process of stacking the layers, occurrence of cracks can be suppressed. Further, the implemented embodiment of FIGS. 6(a) to 6(g) includes the groove region 12 and therefore stress caused by heating can be relieved by the groove region 12. Consequently, it is possible to suppress occurrence of cracks more effectively.

By performing the above process, it is possible to obtain the organic EL element of the implemented embodiment of FIG. 3. According to the method of producing shown in FIGS. 6(a) to 6(g), the linear expansivities of the stacked layers are adjusted, and therefore cracks can be suppressed from occurring. Further, the groove region 12 is formed, and the auxiliary wire 13 is formed inside this groove region 12, and the groove region 12 is filled with the insulating part 14. Therefore, current distribution can be improved, and consequently it is possible to obtain the organic EL element with more uniform light emission in plane and improved light-outcoupling efficiency. Note that, when at least one of the auxiliary wire 13 and the insulating part 14 is unnecessary, a corresponding process of forming may be omitted from the process shown in FIGS. 6(a) to 6(g).

Note that, the organic EL element of the implemented embodiment of FIG. 4 may be produced in accordance with the process of producing shown in FIGS. 6(a) to 6(g). In more detail, the process of producing the organic EL element of the implemented embodiment of FIG. 4 is the same as the process shown in FIGS. 6(a) to 6(g) except the insulating layer 15 is formed on the surface of the translucent substrate 1 before the LR layer 2 is formed. Accordingly, it is possible to obtain the organic EL element of the implemented embodiment of FIG. 4.

According to the present invention, it is possible to produce a lighting device by use of the above organic EL element. This lighting device includes the organic EL element, and therefore the light emitting performance of the lighting device can be improved. The shape of the light emitting surface of one organic EL element may be a rectangular or square shape with 10 cm or more in length and 10 cm in width or more, for example, but is not limited thereto. The lighting device may include a plurality of organic EL elements arranged in plane. The lighting device may include a wiring structure for supplying energy to the organic EL element. The lighting device may include a casing for holding the organic EL element. The lighting device may include a plug for electrically interconnecting the organic EL element and a power supply. The lighting device may have a panel shape. The lighting device may have a plane shape. The lighting device can be thinned, and therefore it is possible to provide a lighting fixture suitable for saving space.

EXAMPLES

The organic EL element which corresponded to the implemented embodiment of FIG. 1 but was devoid of the auxiliary electrode 10 and the insulating film 11 was prepared. The translucent substrate 1 includes the moisture-proof layer 1a made of a glass substrate. This glass substrate has a refractive index of 1.51 and a linear expansivity of $32 \times 10^{-6}/°$ C.

Further, on the surface of the glass substrate, the LR layer 2 and the HR layer 3 were formed by application. The materials used for Examples and Comparative Examples are listed below.

In Example 1, the material of the LR layer 2 is resin (refractive index: 1.51) containing filler, and the material of the HR layer 3 is resin (refractive index: 1.82) containing high refractive index fine particles.

In Example 2, the material of the LR layer 2 is resin (refractive index: 1.50) containing filler, and the material of the HR layer 3 is resin (refractive index: 1.82) containing high refractive index fine particles.

In Example 3, the material of the LR layer 2 is resin (refractive index: 1.48) containing filler, and the material of the HR layer 3 is resin (refractive index: 1.68) containing high refractive index fine particles.

In Comparative Example 1, the material of the LR layer 2 is resin (refractive index: 1.48) containing filler, and the material of the HR layer 3 is resin (refractive index: 1.82) containing high refractive index fine particles.

In Comparative Example 2, the material of the LR layer 2 is resin (refractive index: 1.48) containing filler, and the material of the HR layer 3 is resin (refractive index: 1.72) containing high refractive index fine particles.

Note that, the linear expansivities of the LR layer 2 and the HR layer 3 used in Examples and Comparative Examples are listed in TABLE 1. The uneven structure 4 at the interface between the LR layer 2 and the HR layer 3 was formed by use of material containing particles as the material of the LR layer 2.

The substrate with the light-outcoupling structure provided by stacking of the LR layer 2 and the HR layer 3 was prepared. Thereafter, the first electrode 5, the organic light emitting layer 6 and the second electrode 7 were stacked by deposition, and they were enclosed with the enclosing member 8. The first electrode 5 was made of ITO. The second electrode 7 was made of Al. The enclosing member 8 was made of glass material with a recess. By doing so, the organic EL element was produced.

The substrates with the light-outcoupling structures of Examples and Comparative Examples were subjected to heat shock at 200° C. for 15 minutes, and presence or absence of cracks was observed visually and with an optical microscope. TABLE 1 shows results of such observation.

As shown in TABLE 1, it is confirmed that cracks are suppressed when the linear expansivities fulfill the relation of $\alpha \leq \beta \leq \gamma$.

TABLE 1

| | Linear Expansivity [$10^{-6}/°$ C.] | | | Presence or absence of clacks after heat shock |
|---|---|---|---|---|
| | Moisture Proof layer ($\alpha$) | Low refractive layer ($\beta$) | High refractive layer ($\gamma$) | |
| Example 1 | 32 | 55 | 56 | Absence |
| Example 2 | 32 | 43 | 56 | Absence |
| Example 3 | 32 | 72 | 85 | Absence |
| Comparative Example 1 | 32 | 72 | 56 | Presence |
| Comparative Example 2 | 32 | 72 | 61 | Presence |

REFERENCE SIGNS LIST

1 Translucent substrate
1a Moisture-proof layer
2 LR layer
3 HR layer
4 Uneven structure
5 First electrode
6 Organic light emitting layer
7 Second electrode
8 Enclosing member
9 Enclosed inner space
10 Auxiliary electrode
11 Insulating film
12 Groove
13 Auxiliary wire
14 Insulating part
15 Insulating layer
16 Extended electrode

The invention claimed is:

1. An organic electroluminescence element, comprising:
a translucent substrate;
a first electrode with light transmissive properties;
an organic light emitting layer;
a second electrode;
an LR layer;
an HR layer having a refractive index higher than a refractive index of the LR layer;
an uneven structure provided at an interface between the LR layer and the HR layer;
a groove region dividing at least the HR layer; and
an auxiliary wire provided inside the groove region,
the first electrode, the organic light emitting layer, and the second electrode being stacked on the translucent substrate in this order,
the translucent substrate including a moisture-proof layer facing the first electrode,
the LR layer and the HR layer being situated between the moisture-proof layer and the first electrode in this order from the moisture-proof layer,
the organic electroluminescence element satisfying a relation of $\alpha \leq \beta \leq \gamma$, wherein $\alpha$ denotes a linear expansivity of the moisture-proof layer, $\beta$ denotes a linear expansivity of the LR layer, and $\gamma$ denotes a linear expansivity of the HR layer,
the groove region being constituted by a plurality of straight grooves extending in a horizontal direction and in a vertical direction,
the groove region having a mesh-like shape, a grid-shape, or a lattice shape,
the auxiliary wire being in contact with the first electrode and having a shape corresponding to a shape of the groove region in a plan view, and
parts of the first electrode being formed inside the groove region.

2. The organic electroluminescence element according to claim 1, further comprising:
an auxiliary electrode which has a mesh-like shape and is provided on a surface of the first electrode.

3. The organic electroluminescence element according to claim 2, further comprising:
an insulating film on a side of the auxiliary electrode close to the organic light emitting layer.

4. The organic electroluminescence element according to claim 1, wherein
the groove region divides both the HR layer and the LR layer.

5. The organic electroluminescence element according to claim 1, wherein
the groove region becomes smaller in width towards its bottom than at its top.

6. The organic electroluminescence element according to claim 1, wherein
the auxiliary wire has a thickness equal to or shorter than a depth of the groove region.

7. The organic electroluminescence element according to claim 1, further comprising:
an insulating part provided inside the groove region so as to be closer to the second electrode than the auxiliary wire is.

8. The organic electroluminescence element according to claim 1, further comprising:
an insulating layer between the moisture-proof layer and the LR layer, the organic electroluminescence element satisfying a relation of $\alpha \leq \sigma \leq \beta \leq \gamma$, wherein σ denotes a linear expansivity of the insulating layer.

9. The organic electroluminescence element according to claim 1, wherein:
the LR layer is made of a resin, and
the HR layer is made of a resin.

10. The organic electroluminescence element according to claim 7, wherein
the insulating part fills up the groove region and forms a flat surface with the first electrode.

* * * * *